FIG. I
PRIOR ART
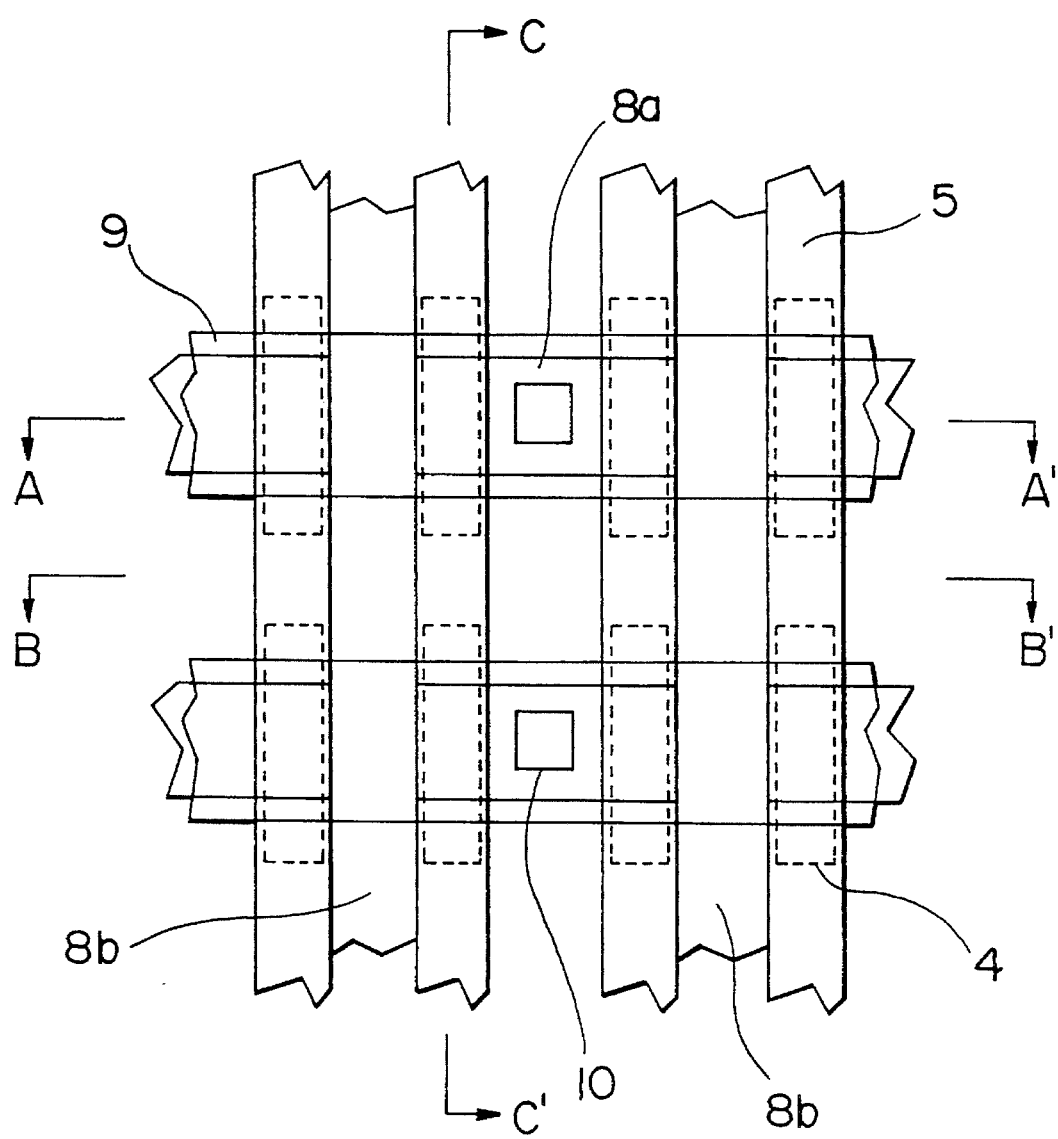

United States Patent [19]
Hara

[11] Patent Number: 5,510,282
[45] Date of Patent: Apr. 23, 1996

[54] METHOD FOR MANUFACTURING A NONVOLATILE SEMICONDUCTOR MEMORY DEVICE USING A RESIDUAL SIDEWALL FILM

[75] Inventor: Hideki Hara, Tokyo, Japan

[73] Assignee: NEC Corporation, Tokyo, Japan

[21] Appl. No.: 318,390

[22] Filed: Oct. 5, 1994

[30] Foreign Application Priority Data

Oct. 7, 1993 [JP] Japan .................................. 5-251552

[51] Int. Cl.$^6$ ............................................ H01L 21/8247
[52] U.S. Cl. .................................................. 437/43; 437/984
[58] Field of Search ........................... 437/43, 195, 984; 148/DIG. 131

[56] References Cited

U.S. PATENT DOCUMENTS 5,019,527  5/1991  Ohshima et al. ........................ 437/43
5,366,913  11/1994  Nakao ..................................... 437/984

Primary Examiner—Chandra Chaudhari
Attorney, Agent, or Firm—Burns, Doane, Swecker & Mathis

[57] ABSTRACT

Gate insulating film of a memory cell in a nonvolatile semiconductor memory devices is protected from a plasma damage by a residual side wall insulating film. After forming field oxide films and first gate insulating films, gate structures each including a control gate, a second insulating film and a floating gate is formed. A fourth insulating films are deposited on the entire surface and ion-etched to leave residual side wall insulating films at the side walls of each of the gate structures. The residual side wall films protect the first gate insulating films and silicon substrate from a plasma damage. At least one of the source and drain is formed in a LDD structure due to the ion-implantation through the residual side wall insulating films. Resistance characteristics to breakdown due to a high voltage can be improved by reducing deterioration of the first gate insulating films. Other electric characteristics can be improved by the LDD structure.

5 Claims, 25 Drawing Sheets

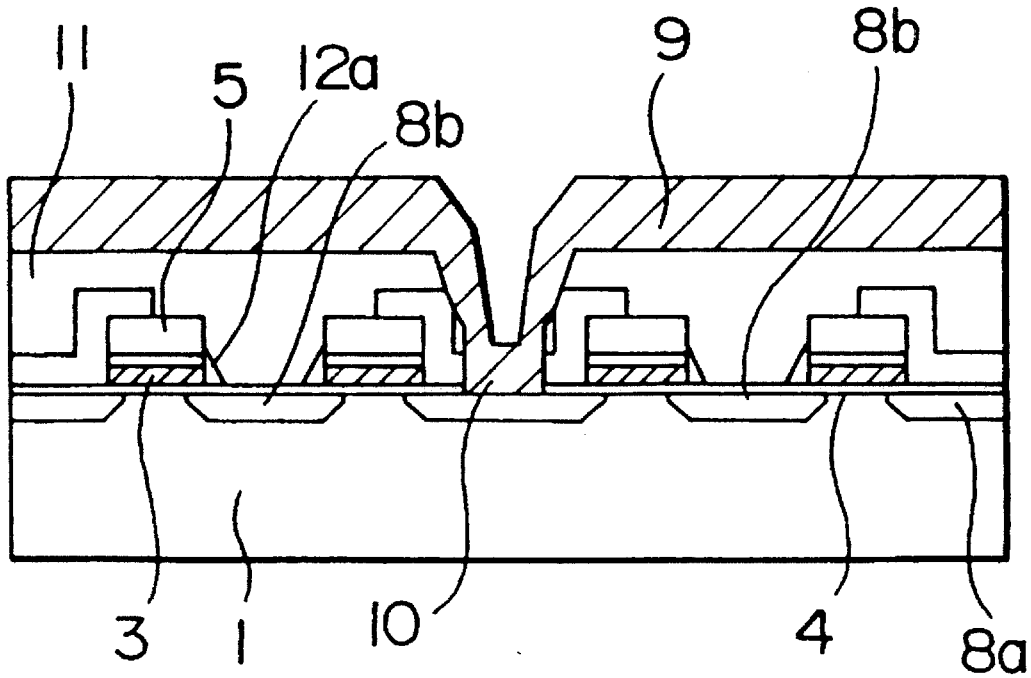

PRIOR ART

PRIOR ART

PRIOR ART

PRIOR ART

PRIOR ART

PRIOR ART

METHOD FOR MANUFACTURING A NONVOLATILE SEMICONDUCTOR MEMORY DEVICE USING A RESIDUAL SIDEWALL FILM

BACKGROUND OF THE INVENTION (a) Field of the Invention

The present invention relates to a method for manufacturing a nonvolatile semiconductor memory device and, more particularly, to a method for manufacturing an electrically erasable programmable read only memory (EEPROM).

(b) Description of the Related Art

Nonvolatile semiconductor memory devices retain data written thereto even when their power is turned off. Active research has been conducted to develop nonvolatile semiconductor memory devices.

Of nonvolatile semiconductor memory devices, EEPROMs or flash memories have a memory cell structure advantageous for finer patterning, and consequently are stilted for implementing highly integrated devices. Japanese Patent After-Exam. (KOKOKU) Publication No. 63-41224 discloses a technique for forming source regions in a self aligned structure in which gate electrode layers are used as a mask to obtain memory cells having a finer pattern. FIG. 1 is a schematic plan view showing a memory device having self aligned sources disclosed in the publication as mentioned above. FIGS. 2A, 2B and 2C, FIGS. 3A, 3B and 3C, 4A, Figs. 4B and 4C, 5A, FIGS. 5B and 5C, 6A, FIGS. 6B and 6C, and FIGS. 7A, 7B and 7C are cross-sectional views of the semiconductor memory device of FIG. 1 for showing consecutive steps of a manufacturing process of the prior art. FIGS. 2A–7A show cross-sections taken along line A—A' in FIG. 1, FIGS. 2B–7B show cross-sections taken along line B—B' and FIGS. 2C–7C show cross-sections taken along line C—C' in FIG. 1.

First, as shown in FIGS. 2A, 2B and 2C (hereinafter also referred to as FIGS. 2A–2C), first insulating films or field oxide films 2 each having a thickness of 3000–8000 angstroms are formed on a P-type silicon substrate 1 by using a known LOCOS technique, the field oxide films extending in a first direction (horizontal direction as viewed in FIG. 1) and in parallel to each other. Subsequently, as shown in FIGS. 3A–3C, second insulating films or first gate insulating films 4, each made of a thermal oxide film having a thickness of 100–200 angstroms, are formed between two of the field oxide films, following which a first polysilicon layer having a thickness of 1000–3000 angstroms is formed on the entire surface by chemical vapor deposition (CVD). Then, patterning is performed on the first polysilicon layer to form floating gate layers 3 each extending in the first direction on the first gate insulating film 4 and the edge portions of the field oxide films 2 (FIGS. 3A–3C).

Then a third insulating film is formed on the entire surface as an ONO-laminate having a thickness of 100–300 angstroms and three layers including a silicon oxide film, a silicon nitride film, and another silicon oxide film. Next, a second polysilicon layer having a thickness of 2000–4000 angstroms is formed by CVD on the entire surface. Then, by using a known anisotropic etching technique, patterning is performed on the second polysilicon layer to make control gates 5 extending in a second direction perpendicular to the first direction. Patterning is also performed on the second gate insulating film 6 and floating gate layers 3 using each of the control gates 5 as a mask to obtain gate structures as shown in FIGS. 4A–4C.

Subsequently, a photoresist pattern 7 is formed, in which openings 13 thereof have edges on the central portions of the control gates 5, as shown in FIGS. 5A–5C. With the photoresist pattern 7 and the control gates 5 used as a mask, anisotropic etching is performed on the field oxide films 2 to selectively expose portions of the semiconductor substrate 1 in which source regions are to be formed. Then, by using an ion implantation technique, N-type impurity ions such as phosphorus (P) ions are implanted to the exposed portions of the semiconductor substrate 1 to form source regions extending in the second direction, i.e. vertical direction as viewed in FIG. 1. After removing the photoresist pattern 7 by an ion-etching technique or the like, N-type impurity ions such as arsenic (As) ions are selectively introduced to the substrate regions including the source regions 8b and other portions opposite to the source regions 8b with respect to the gate structures, thereby obtaining N-type source regions 8b and N-type drain regions 8a, as shown in FIGS. 6A–6C. The source regions 8b extend in the vertical direction as viewed in FIG. 1 while the drain regions 8a are separated from each other by the field oxide films 2 in the vertical direction as viewed in FIG. 1.

Next, as shown in FIGS. 7A–7C, after depositing an interlayer insulating film 11 made of a silicon oxide film containing, for example, boron (B) or phosphorus (P), contact holes 10 are formed in the interlayer insulating films 11 and the first gate insulating film 4 for exposing portions of the drain regions 8a by using a known photolithographic technique. Then, an aluminum layer is deposited on the entire surface, and patterning is performed thereon to obtain aluminum interconnection 9.

The conventional method for manufacturing a nonvolatile semiconductor memory device as described above is employed primarily for manufacturing flash memories in which erasing of data is performed from the source regions by applying a high voltage, e.g. 12 volts, to the source regions. Since the method allows source regions to be formed in a self aligned structure, it is not necessary to provide an alignment margin between the source regions and the gate electrode layers. Accordingly, the conventional method is suited for a finer patterning of memory cells in flash memories.

It has been long requested that nonvolatile semiconductor memory devices have more reliable characteristics and be manufactured in a higher integration and in a higher yield.

SUMMARY OF THE INVENTION

In view of the foregoing, it is an object of the present invention to provide an improved method for manufacturing a nonvolatile semiconductor memory device (EEPROM) in which source regions are formed in a self aligned structure, and which realizes a higher reliability, a higher integration and a higher yield of the memory device.

In accordance with the present invention, there is provided an improved method for manufacturing a semiconductor memory device having floating gates and control gates. The method includes steps of: forming a plurality of first insulating films extending in a first direction and in parallel to each other on a semiconductor substrate; forming a plurality of second insulating films each extending on the semiconductor substrate between adjacent two of the first insulating films; forming on each of the second insulating films a plurality of gate structures each including consecutive layers of a floating gate, a third insulating film and a control gate; forming a fourth insulating film at least on the gate structures; selectively dry-etching the fourth insulating film to leave residual side wall films at a first side of each of the gate structures; after said dry-etching, selectively introducing impurity ions of a second conductivity type to first regions of the semiconductor substrate adjacent to the first side of each of the gate structures; and selectively introducing impurity ions to second regions of the semiconductor substrate adjacent to a second side of each of the gate structures opposite to the first side.

In the method for manufacturing semiconductor memory devices according to the present invention, since the fourth insulating film is etched to form residual side walls for the gate structure thereby protecting the gate structure, especially first gate insulating film thereof, from a plasma damage during dry-etching and ion-implantation, resistance for breakdown due to a high voltage can be improved. Moreover, the residual side walls produce an LDD structure in the source regions, so that reliability of the memory device can be further improved.

BRIEF DESCRIPTION OF THE DRAWINGS

The above and other objects, as well as features and advantage of the present invention will be more apparent from the following description, taken in conjunction with accompanying drawings in which:

FIG. 1 is a schematic plan view showing a nonvolatile semiconductor memory device fabricated by a conventional method;

DESCRIPTION OF THE PREFERRED EMBODIMENTS

Figure 2A:
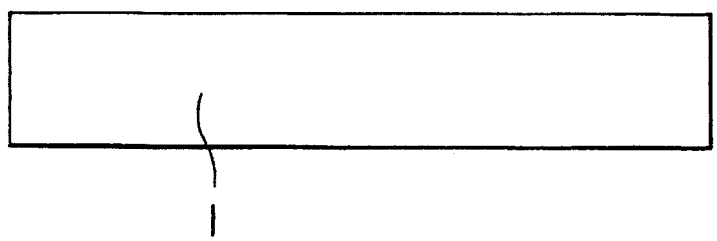
FIGS. 2A, 2B and 2C are cross-sectional views, taken along lines A—A', B—B' and C—C' in FIG. 1, respectively, for showing a first step in manufacturing the nonvolatile semiconductor memory device of FIG. 1.
Figure 2B:
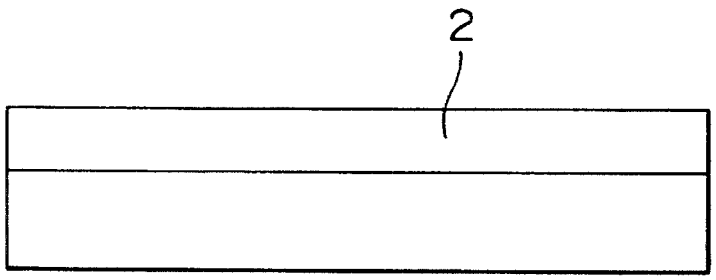
Figure 2C:
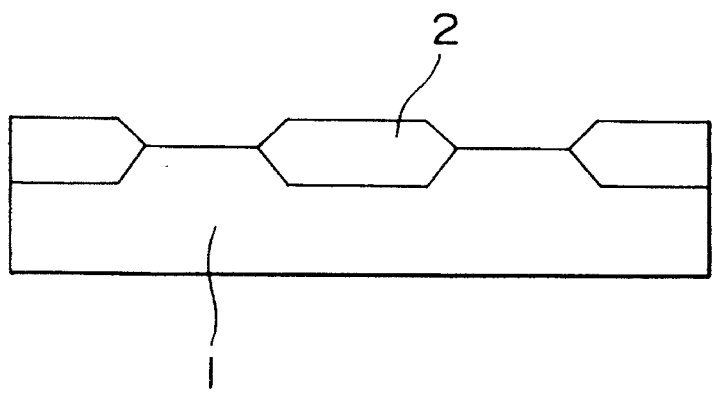
Figure 3A:
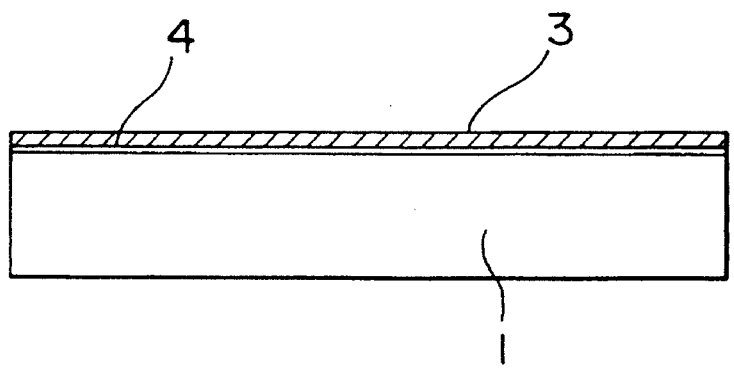
FIGS. 3A, 3B and 3C are cross-sectional views, taken along lines A—A', B—B' and C—C' in FIG. 1, respectively, for showing a second step in manufacturing the nonvolatile semiconductor memory device of FIG. 1.
Figure 3B:
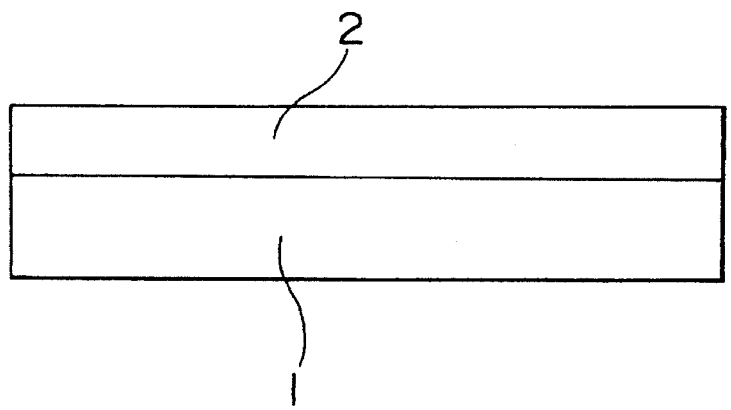
Figure 3C:
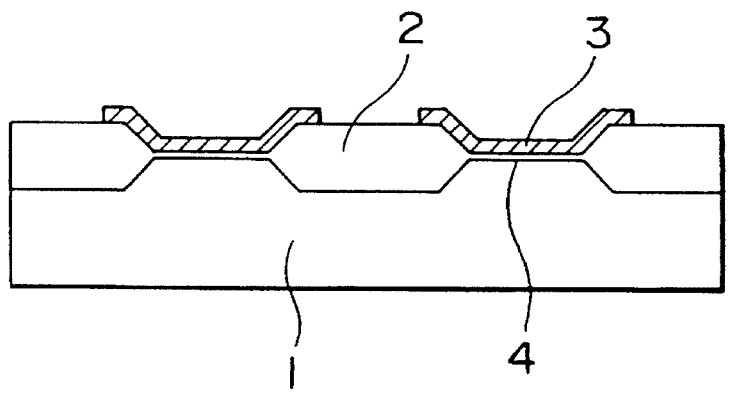
Figure 4A:
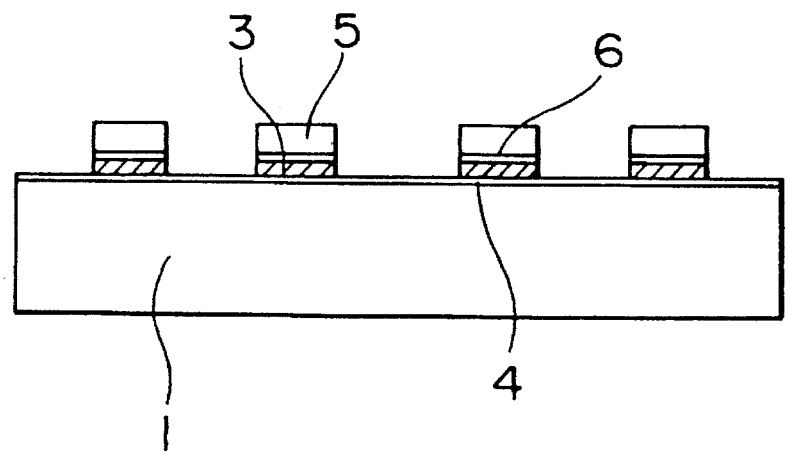
FIGS. 4A, 4B and 4C are cross-sectional views, taken along lines A—A', B—B' and C—C' in FIG. 1, respectively, for showing a third step in manufacturing the nonvolatile semiconductor memory device of FIG. 1.
Figure 4B:
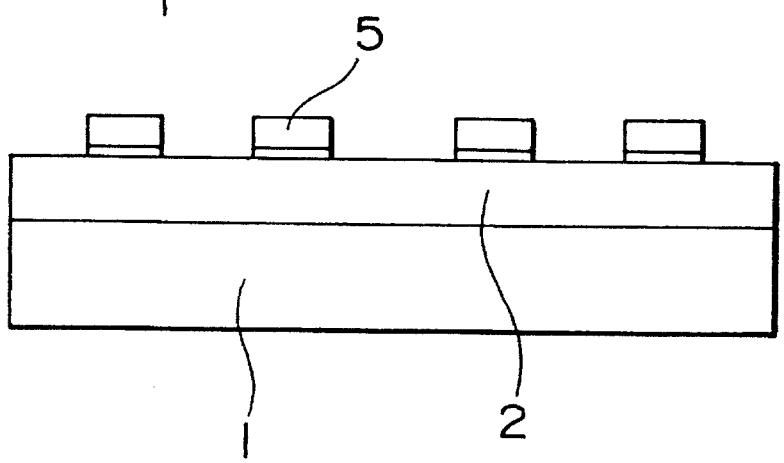
Figure 4C:
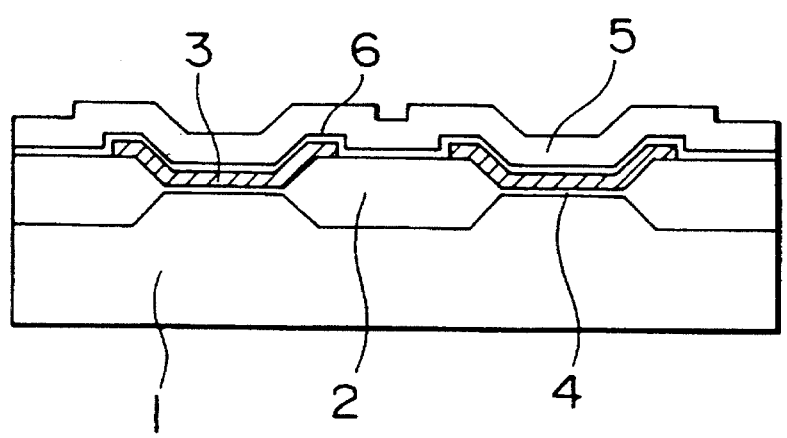
Figure 5A:
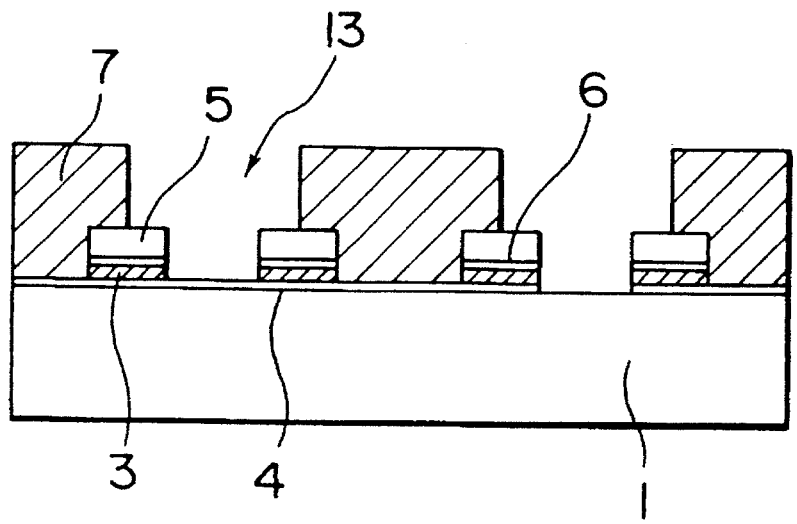
FIGS. 5A, 5B and 5C are cross-sectional views, taken along lines A—A', B—B' and C—C' in FIG. 1, respectively, for showing a fourth step in manufacturing the nonvolatile semiconductor memory device of FIG. 1.
Figure 5B:
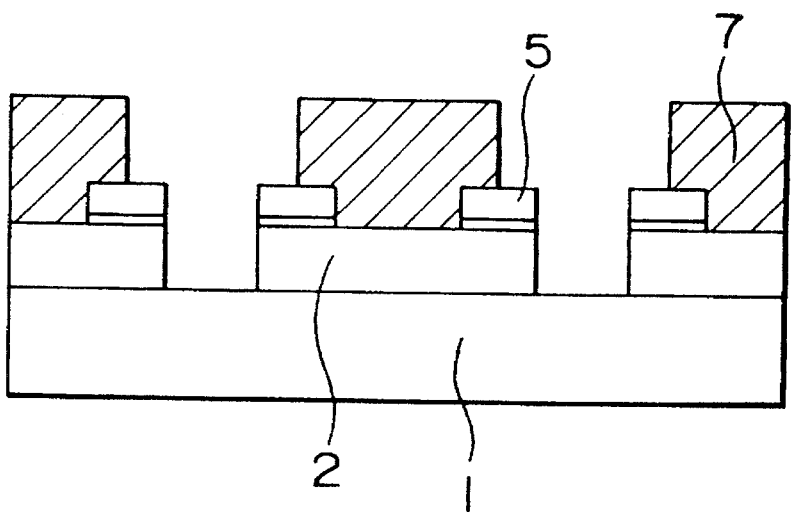
Figure 5C:
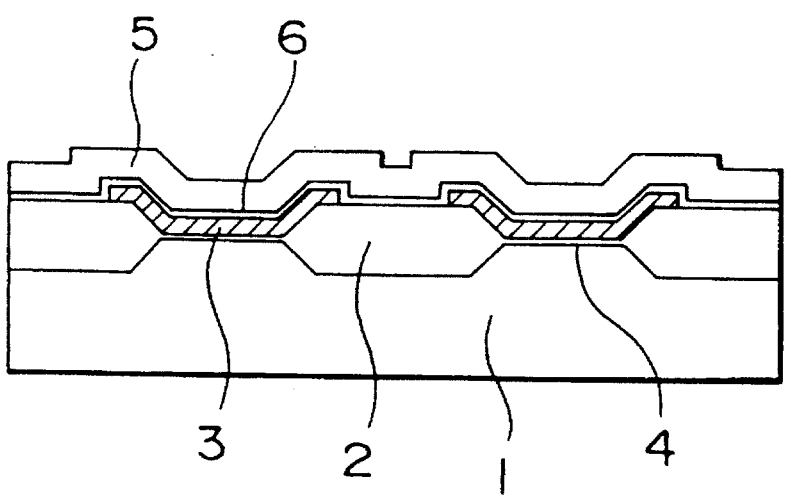
Figure 6A:
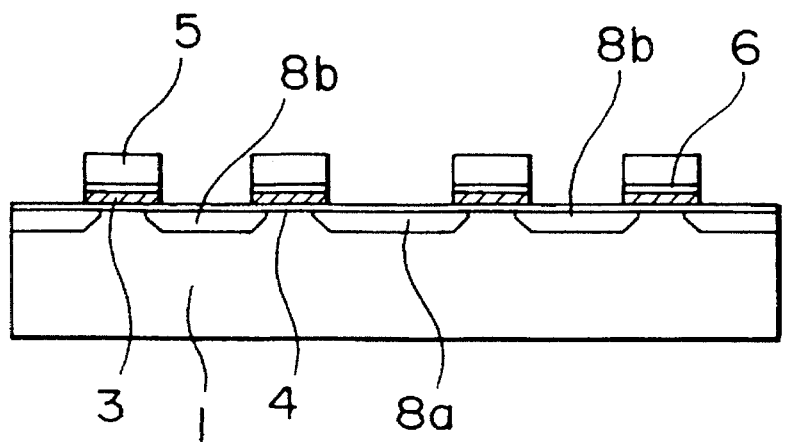
FIGS. 6A, 6B and 6C are cross-sectional views, taken along lines A—A', B—B' and C—C' in FIG. 1, respectively, for showing a fifth step in manufacturing the nonvolatile semiconductor memory device of FIG. 1.
Figure 6B:
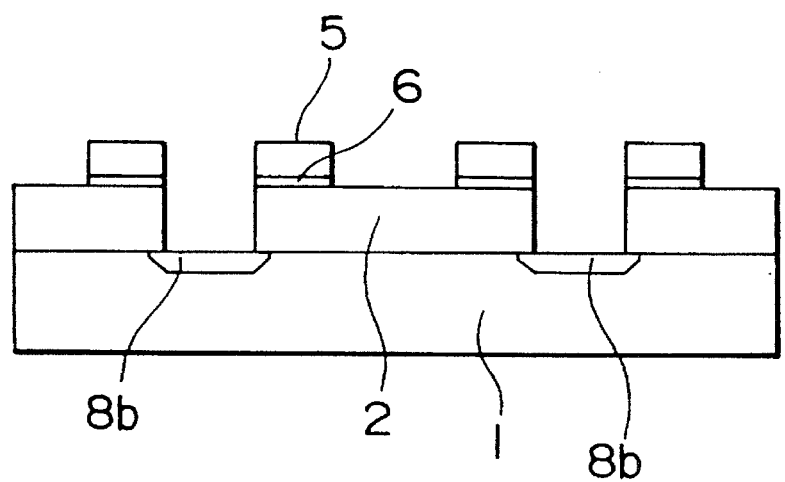
Figure 6C:
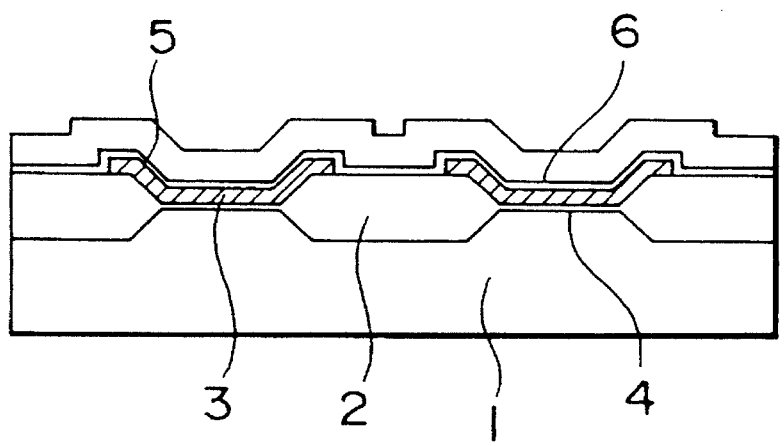
Figure 7A:
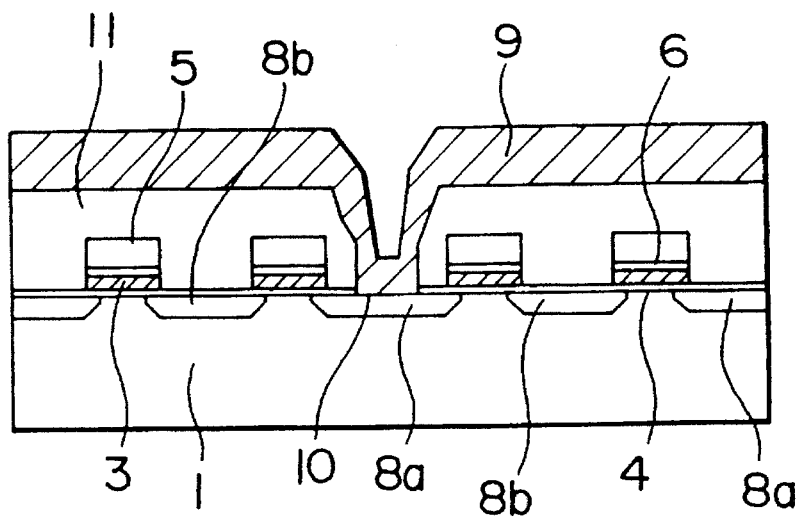
FIGS. 7A, 7B and 7C are cross-sectional views, taken along lines A—A', B—B' and C—C' in FIG. 1, respectively, for showing a final step in manufacturing the nonvolatile semiconductor memory device of FIG. 1.
Figure 7B:
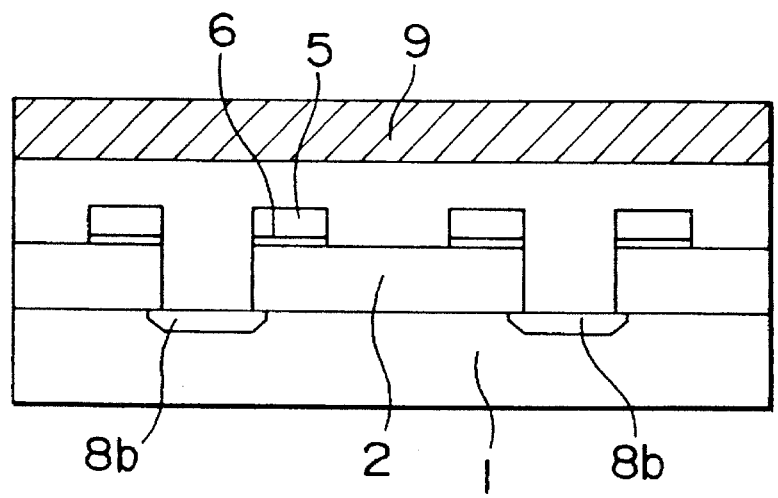
Figure 7C:
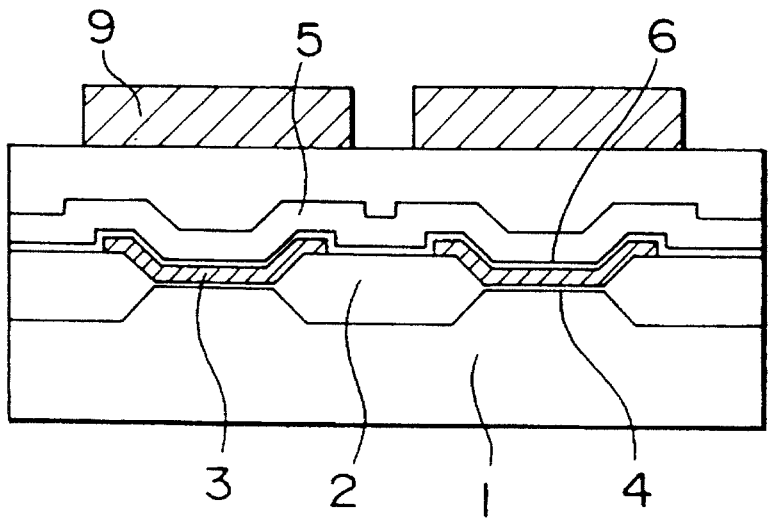
Figure 8:
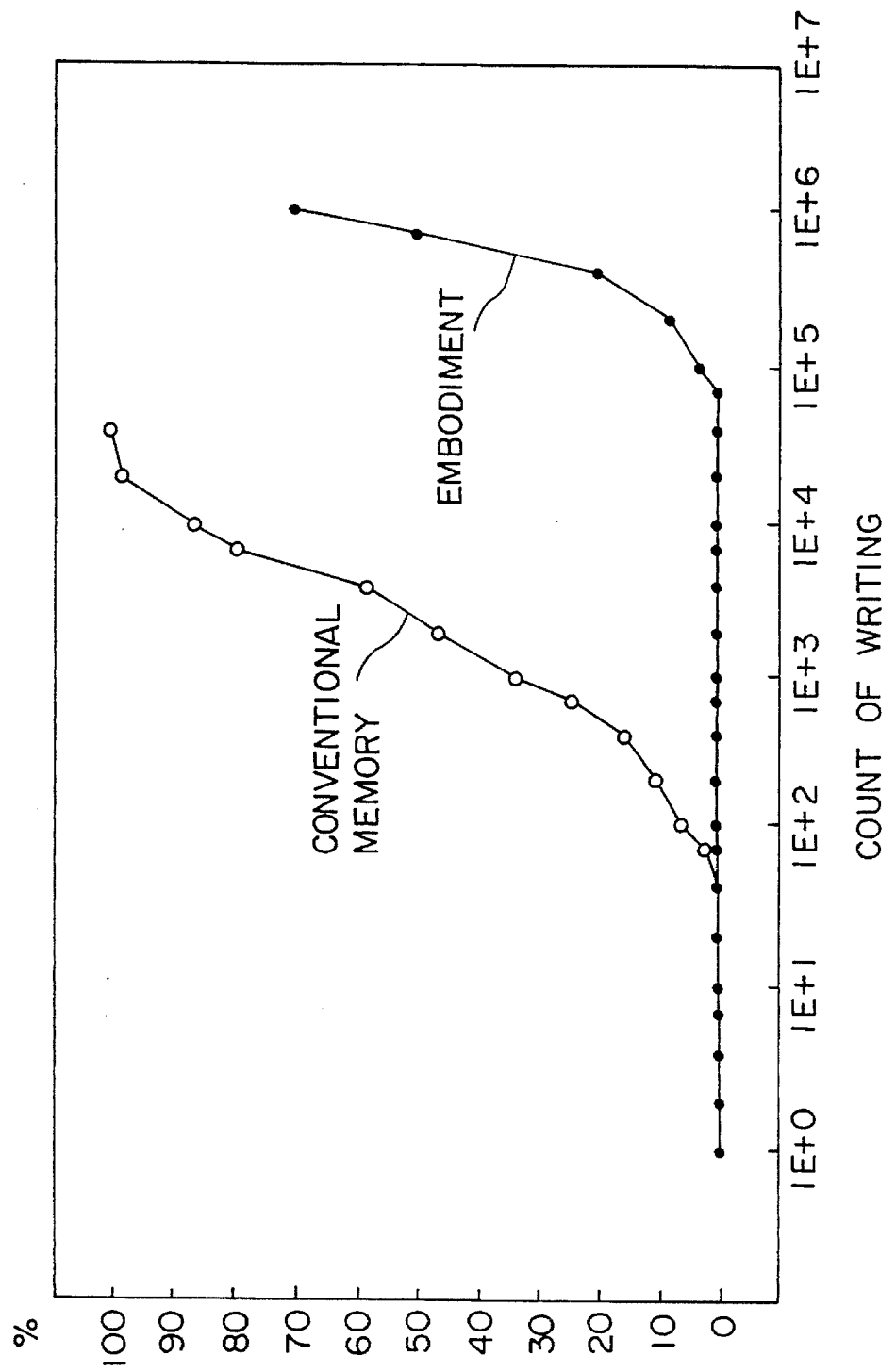
FIG. 8 is a graph showing the dependency of cumulative defective rates (%) of memory devices on a count of repetition of rewriting, for comparing nonvolatile semiconductor memory devices obtained by a conventional manufacturing method and by a manufacturing method of an embodiment of the present invention.

Before describing embodiments of the present invention, problems involved in the prior art will be described first for the sake of understanding of the present invention. In the conventional method as described before, in order to make a thinner oxide film in a flash memory for further scaling up thereof, it is desirable to make a first gate insulating film 4 as thin as about 100 angstroms or less. In such a case, the thin first gate insulating film 4 may break-down during applying a high voltage to the source regions for erasing of data, resulting from a damage by exposure to plasma ions during anisotropic etching for forming source regions. This decreases the maximum count of rewriting for the flash memories (hereinafter referred to as "rewritable count"). FIG. 8 exemplarily shows relationship between the count of repeated rewriting operations for memory cells and the cumulative defective rate (%) observed in semiconductor memory devices manufactured by the conventional method and by a method of the present invention. As seen from FIG. 8, with nonvolatile semiconductor memory devices manufactured by the conventional method, the rewritable count does not exceed even a $10^2$ order, resulting from a poor characteristic due to a plasma damage.

Also, the anisotropic ion-etching (dry-etching) degrades electric characteristics of a memory cell. Particularly, for nonvolatile semiconductor memory devices in which erasing is performed from the source regions, variations in the impurity concentration in a source regions affects erasing speed and writing speed of the memory cell, producing variations in electric characteristics of the semiconductor memory devices. Such variations in characteristics decreases the yield of semiconductor memory devices.

Figure 9:
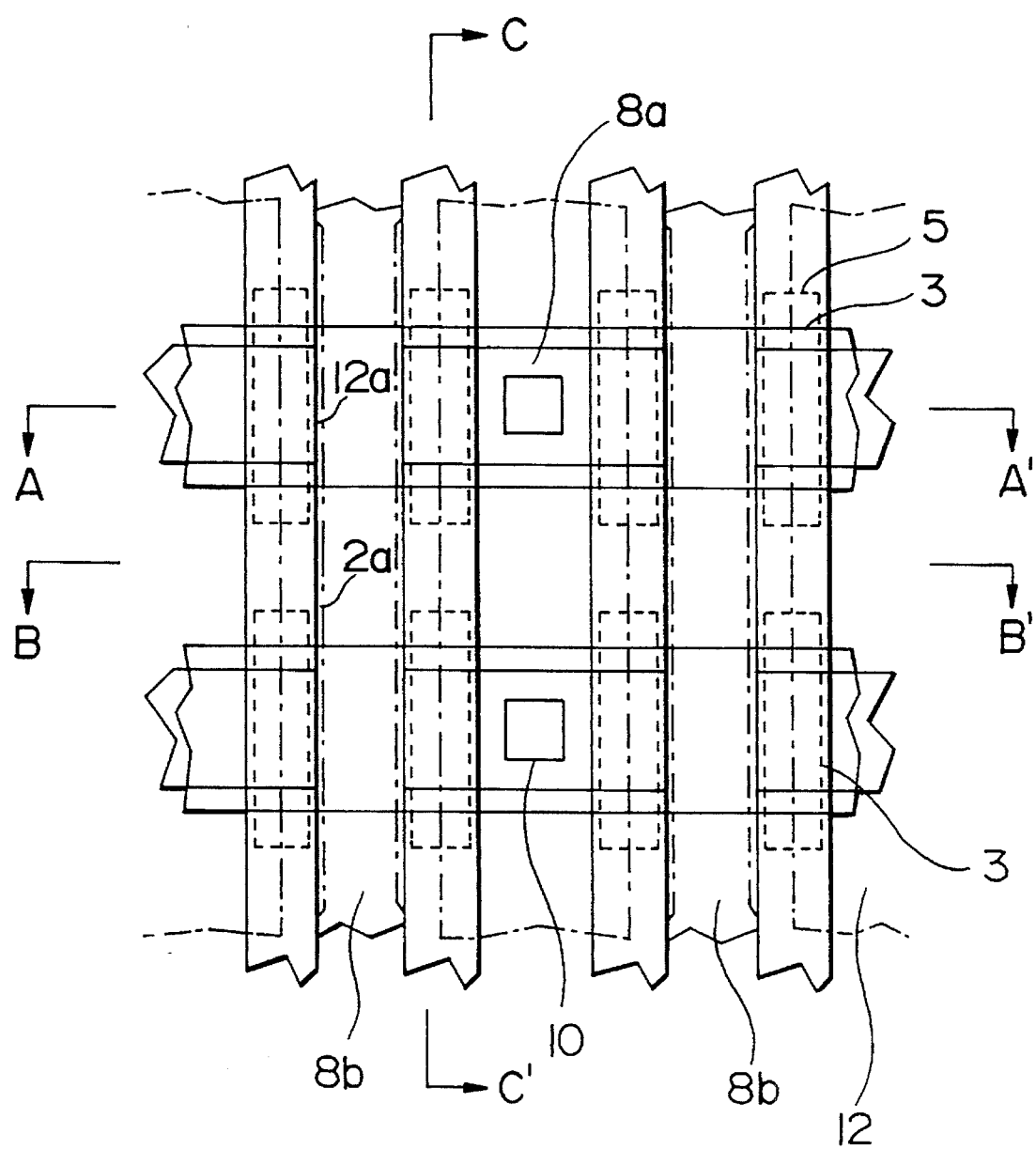
FIG. 9 is a schematic plan view showing a semiconductor memory device manufactured by a method according to a first embodiment of the present invention.
Figure 10A:
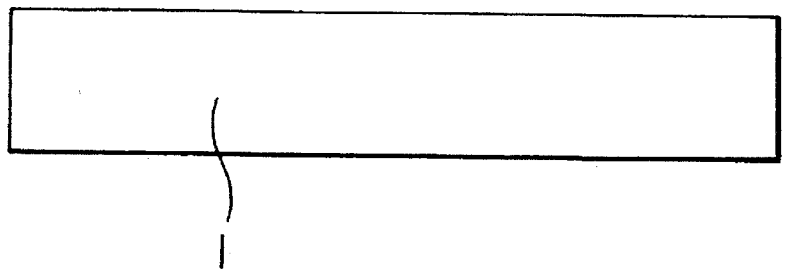
FIGS. 10A, 10B and 10C are cross-sectional views, taken along lines A—A', B—B' and C—C' in FIG. 9, respectively, for showing a first step in manufacturing the nonvolatile semiconductor memory device of FIG. 9.
Figure 10B:
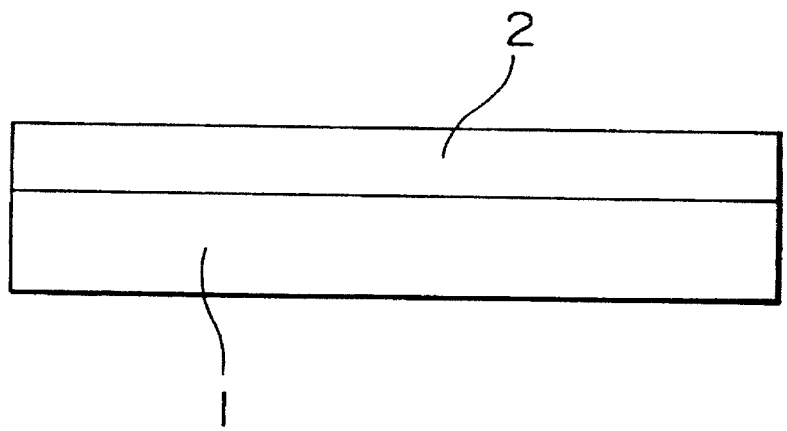
Figure 10C:
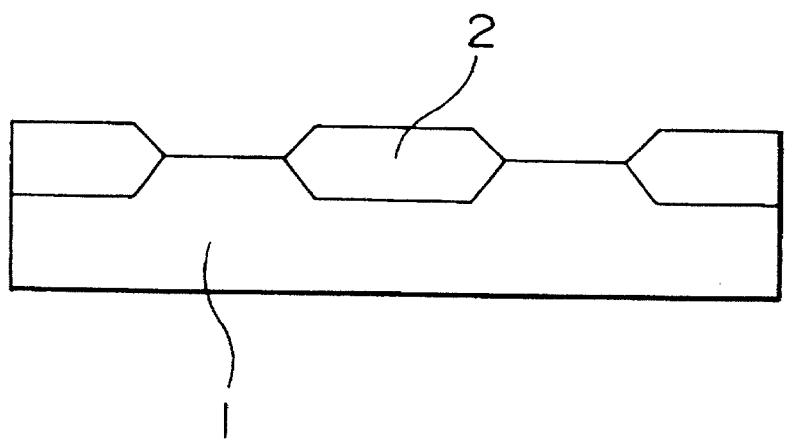

Now, the present invention will be described in detail with reference to the drawings. FIG. 9 shows a semiconductor memory device manufactured by a method according to a first embodiment of the present invention, while FIGS. 10A–10C through FIGS. 16A–16C show consecutive steps for the method according to the first embodiment. In FIGS. 10A–10C, a plurality of thick field oxide films (first insulating films) 2 each having a thickness of 3000–8000 angstroms are formed on a P-type silicon substrate 1 by using a LOCOS technique. The field oxide films 2 extend in a first direction, i.e., the horizontal direction as viewed in FIG. 9 and in parallel to each other.

Figure 11A:
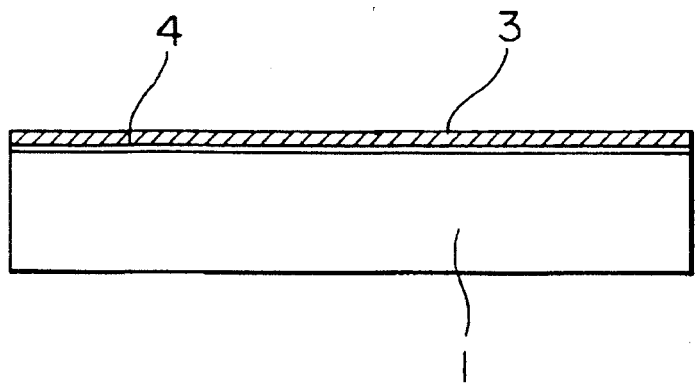
FIGS. 11A, 11B and 11C are cross-sectional views, taken along lines A—A' B—B' and C—C' in FIG. 9, respectively, for showing a second step in manufacturing the nonvolatile semiconductor memory device of FIG. 9.
Figure 11B:
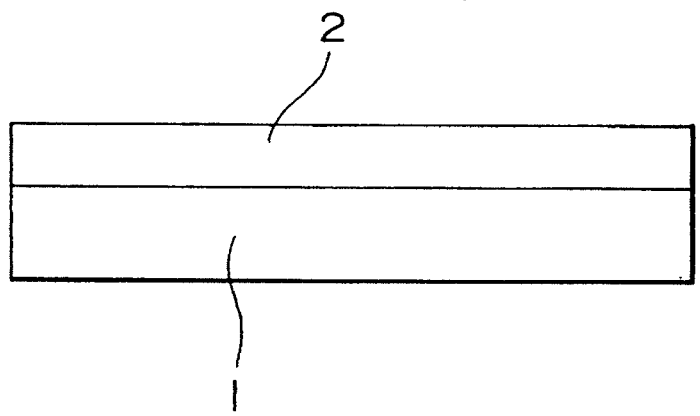
Figure 11C:
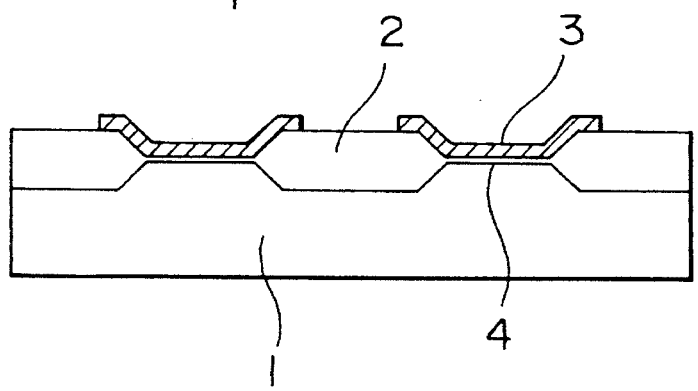

Subsequently, as shown in FIGS. 11A–11C, a plurality of first gate insulating films (second insulating films) 4 are formed on the semiconductor substrate 1 between two of the field oxide films 2 as thermal oxide films having a thickness of 100–200 angstroms. Thereafter, a first polysilicon layer having a thickness of 1000–3000 angstroms is formed by chemical vapor deposition (CVD) on the entire surface, then selectively removed from central portions of the field oxide films 2 by patterning to form floating gate layers 3 extending in a fist direction and in parallel to each other.

Figure 12A:
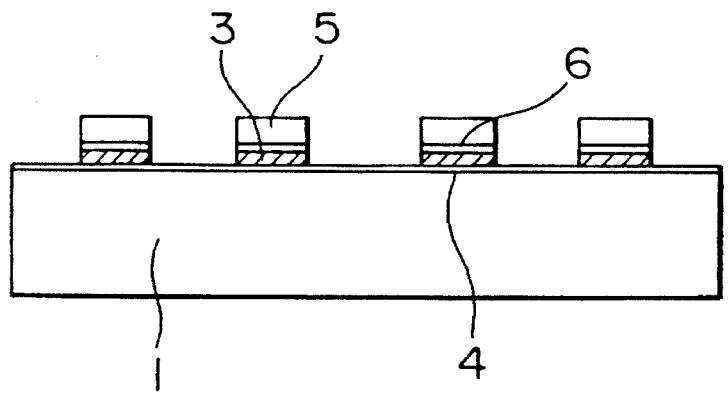
FIGS. 12A, 12B and 12C are cross-sectional views, taken along lines A—A' B—B' and C—C' in FIG. 9, respectively, for showing a third step in manufacturing the nonvolatile semiconductor memory device of FIG. 9.
Figure 12B:
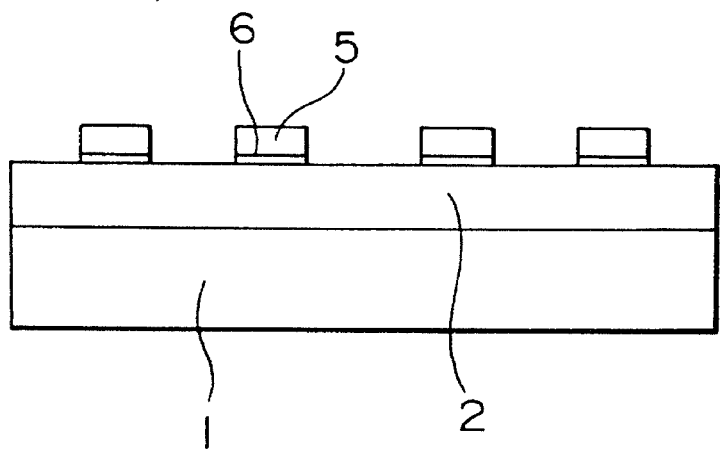
Figure 12C:
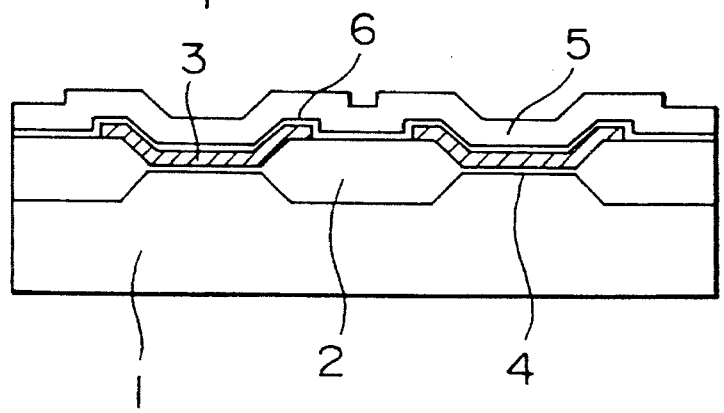

Then, a third insulating film having a thickness of 100–300 angstroms and comprised of three-layers including a silicon oxide film, a silicon nitride film, and another silicon oxide film, is deposited on the entire surface by CVD. Subsequently, a second polysilicon layer having a thickness of 2000–4000 angstroms is deposited by CVD on tile entire surface of the third insulating film. Then, by using a known anisotropic ion-etching technique, patterning is performed on the second polysilicon layer to form control gates 5 extending in a second direction perpendicular to the first direction. Patterning is also performed on the third insulating film and the floating gate layers 3 using the gate electrodes as a mask to form second gate insulating films 6 and separate floating gates 3. Thus, gate structures each including a floating gate 3, a second gate insulating film 6 and control gate 5 is formed on the first gate insulating film 4, as shown in FIGS. 12A–12C. In the gate structures, the control gate 5 and second gate insulating film 6 extend perpendicularly to the field oxide films 2 over the plurality of gate structures, while the floating gates 3 are separated from each other by the field oxide films 4.

Figure 13A:
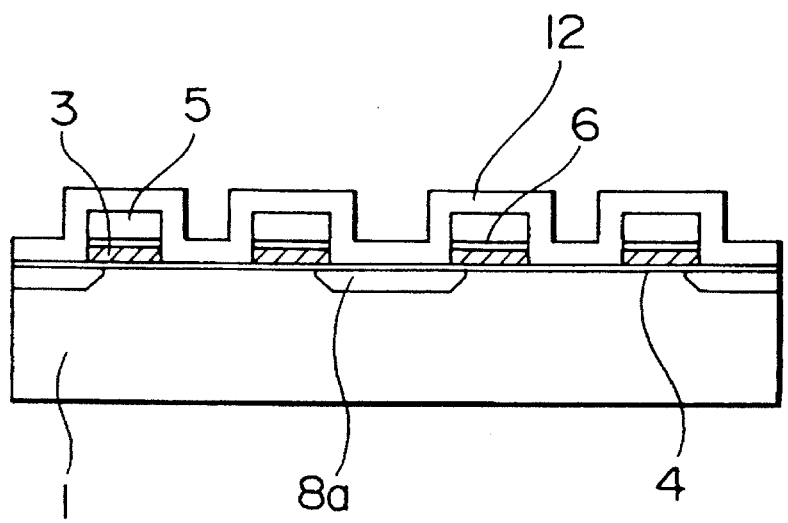
FIGS. 13A, 13B and 13C are cross-sectional views, taken along lines A—A' B—B' and C—C' in FIG. 9, respectively, for showing a fourth step in manufacturing the nonvolatile semiconductor memory device of FIG. 9.
Figure 13B:
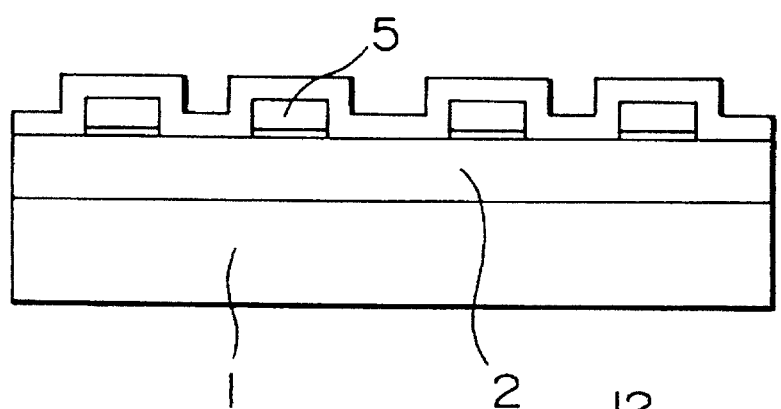
Figure 13C:
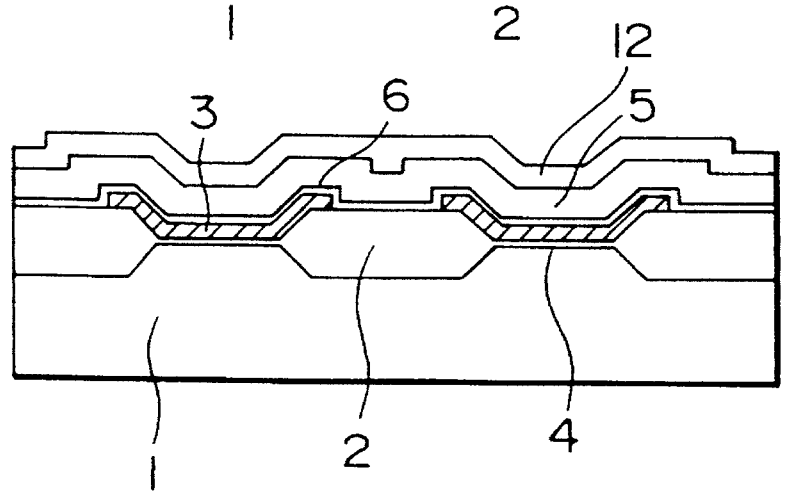

Next, as shown in FIGS. 13A–13C, by using an ion implantation technique, N-type impurity ions such as arsenic (As) ions are selectively implanted to the semiconductor substrate through first gate insulating films 4 to form N-type drains 8a. Then, a fourth insulating film 12 made of silicon oxide is deposited on the entire surface by CVD.

Figure 14A:
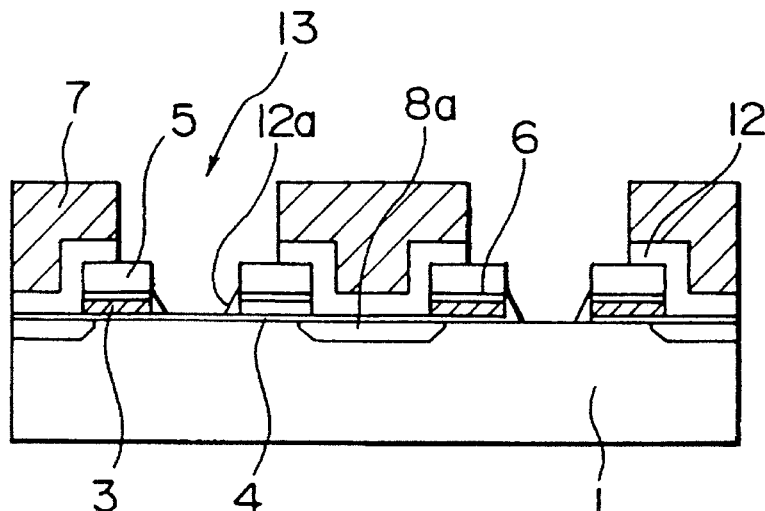
FIGS. 14A, 14B and 14C are cross-sectional views, taken along lines A—A' B—B' and C—C' in FIG. 9, respectively, for showing a fifth step in manufacturing the nonvolatile semiconductor memory device of FIG. 9.
Figure 14B:
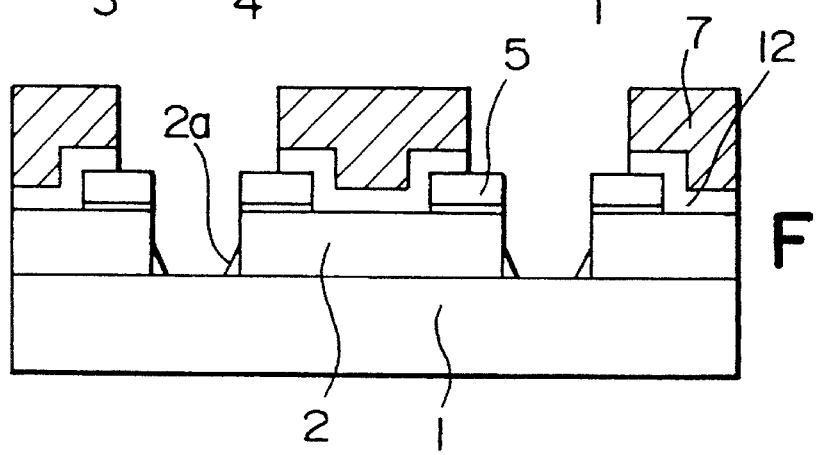
Figure 14C:
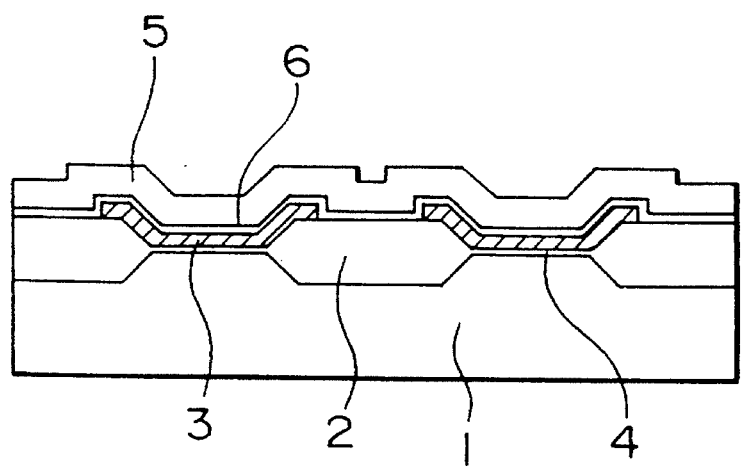

Subsequently, as shown in FIGS. 14A–14C, a photoresist pattern 7 is formed as having openings 13 at areas between two adjacent gate structures where source regions are to be formed. The openings 13 have edges on the adjacent two of control gates 5 at central portions thereof as viewed in the first direction. Then, anisotropic etching is performed on the field oxide films 2 and the fourth insulating film 12, with the photoresist pattern 7 and the control gates 5 used as a mask, to expose substrate portions or the portions of the first insulating films 4. In this step, parts of the fourth insulating film 12 and parts of the field oxide films 2 remain as residual side walls 12a and 2a, respectively, along peripheral edge portions of the area where source regions are to be formed.

Figure 15A:
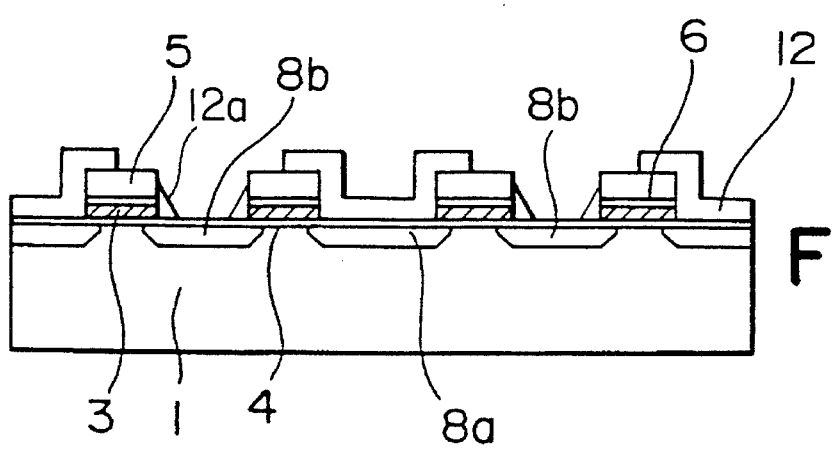
FIGS. 15A, 15B and 15C are cross-sectional views, taken along lines A—A' B—B' and C—C' in FIG. 9, respectively, for showing a sixth step in manufacturing the nonvolatile semiconductor memory device of FIG. 9.
Figure 15B:
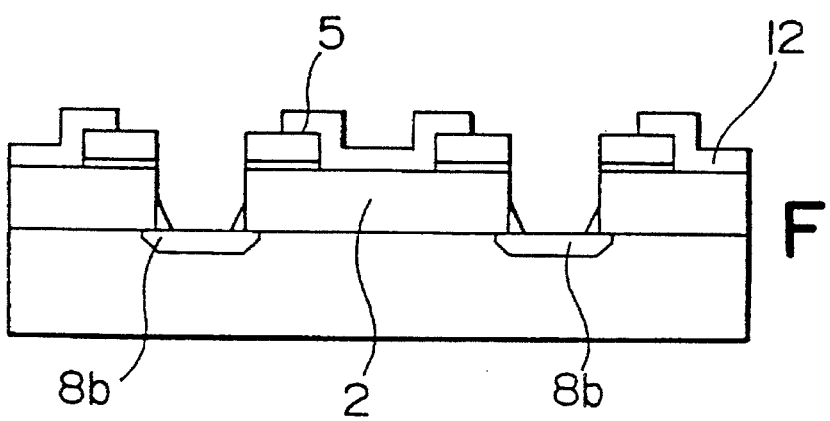
Figure 15C:
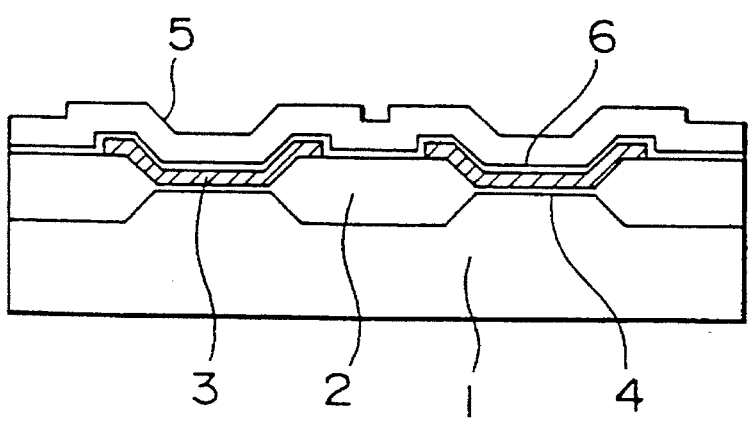
Figure 16A:
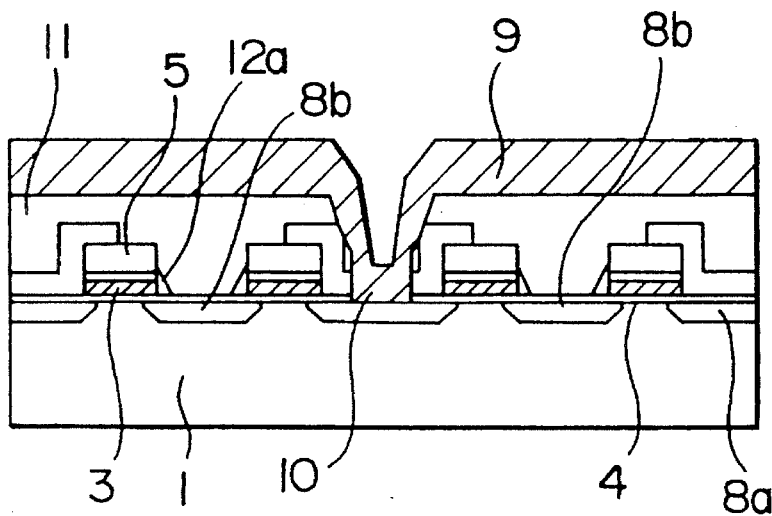
FIGS. 16A, 16B and 16C are cross-sectional views, taken along lines A—A' B—B' and C—C' in FIG. 9, respectively, for showing a final step in manufacturing the nonvolatile semiconductor memory device of FIG. 9.
Figure 16B:
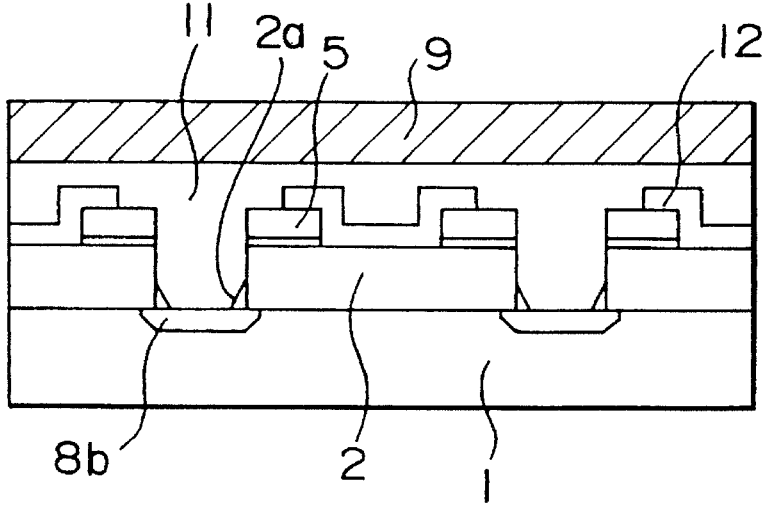
Figure 16C:
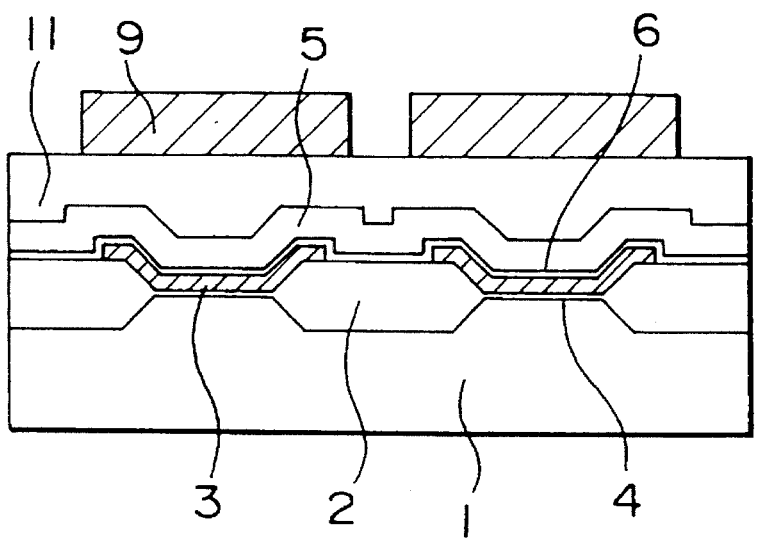

Next, by using an ion-implantation technique or the like, N-type impurity ions such as phosphorus (P) ions are introduced to form source regions 8b, as shown in FIGS. 15A–15C. After depositing an interlayer insulating film 11 made of a silicon oxide containing, for example, boron (B) or phosphorus (P), contact holes 10 are formed therein by using a known photolithographic technique. Then, aluminum is sputtered to deposit on the entire substrate, and patterning is performed thereon to obtain an aluminum interconnection layer 9 as shown in FIGS. 16A–16C.

In the semiconductor memory device manufactured by the method according to the first embodiment, one of side walls of the gate structure adjacent to the sources 8b is protected by the fourth insulating films 12 or residual side walls 12a while anisotropic ion-etching is performed to form a self aligned source, so that plasma damage to the gate structure, especially to the very thin first gate insulating film (tunnel film) 4, is substantially avoided. Moreover, in the peripheral portions of the source regions 8b adjacent to the gate structures, plasma damage to the semiconductor substrate can be reduced by the residual side walls 12a of the insulating films 12, thereby reducing variations and deterioration in electric characteristics of the nonvolatile semiconductor memory device.

Further, when the anisotropic ion-etching is finished, residual side walls 12a and 2a remains along peripheral edge portions of the source regions to be formed. During implanting of impurity ions for forming the source regions, the peripheral portions of the source regions adjacent to the gate structures are formed in a lightly doped drain (LDD) structure, since the impurity ions are introduced to the peripheral portions through the residual side walls 12a and 2a. Hence, the sources thus obtained have a high resistance to a breakdown caused by a high voltage of, for example, 12 V which will be applied thereto for erasure of data in the memory cell during operation thereof.

Figure 17:
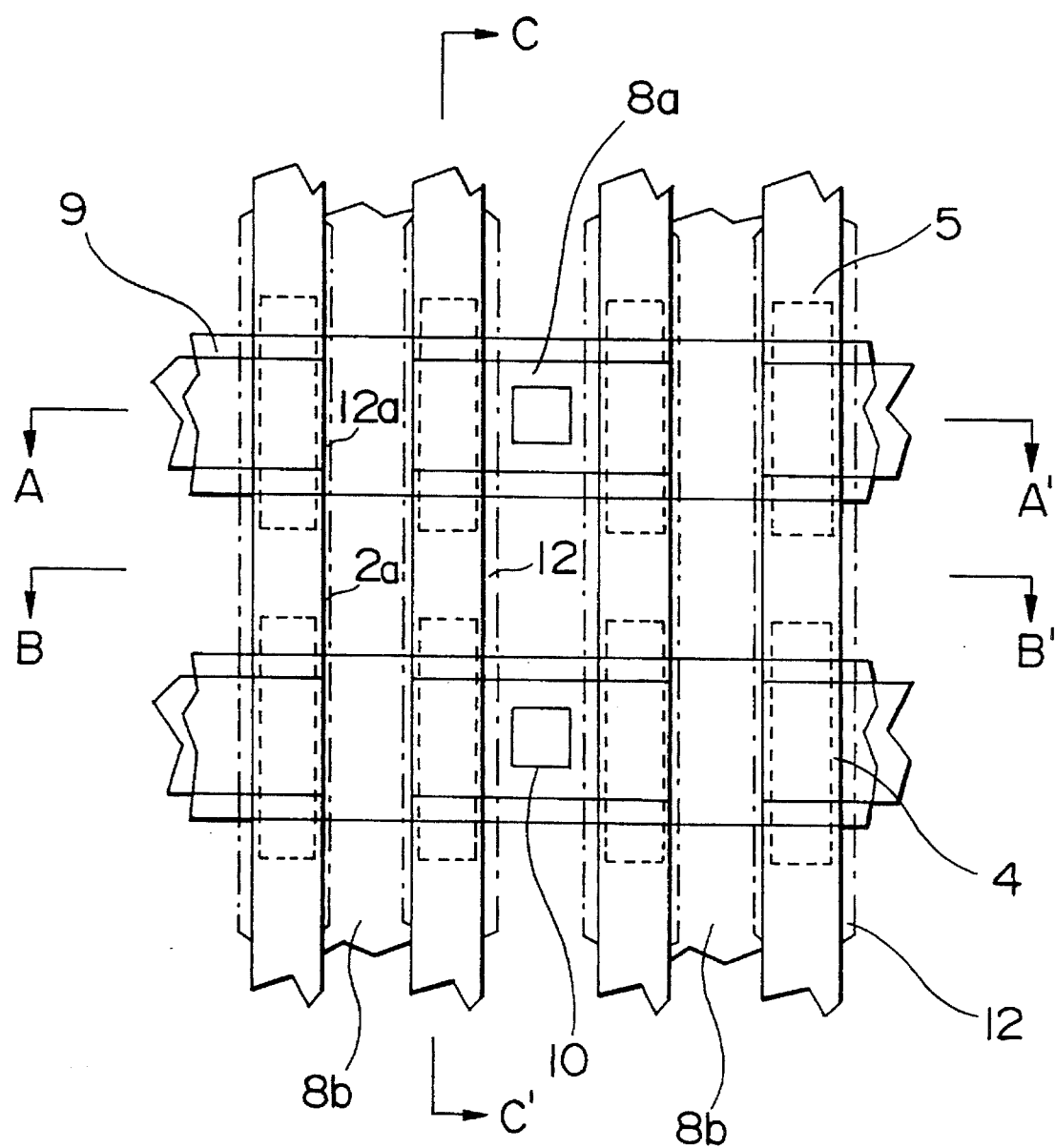
FIG. 17 is a schematic plan view showing a semiconductor memory device manufactured by a method according to a second embodiment of the present invention.
Figure 18A:
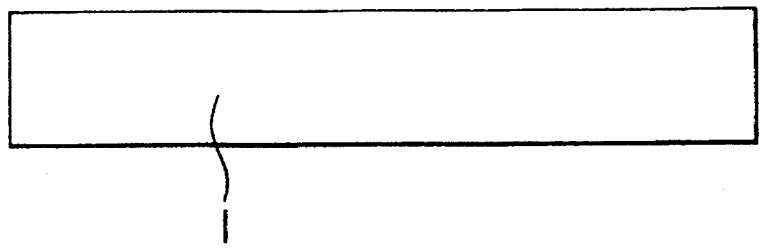
FIGS. 18A, 18B and 18C are cross-sectional views, taken along lines A—A', B—B' and C—C' in FIG. 17, respectively, for showing a first step in manufacturing the nonvolatile semiconductor memory device of FIG. 17.
Figure 18B:
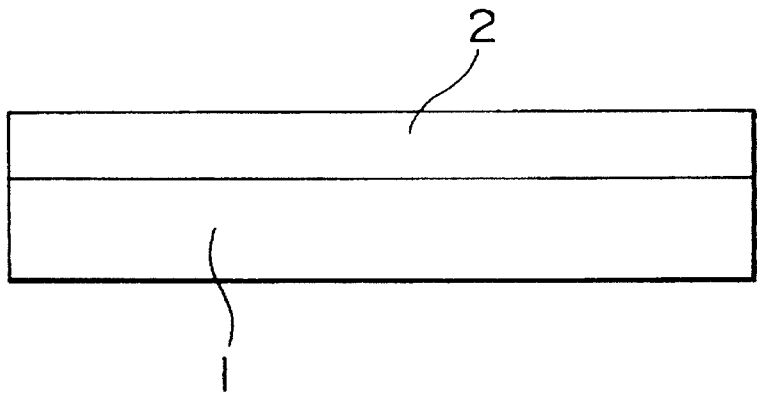
Figure 18C:
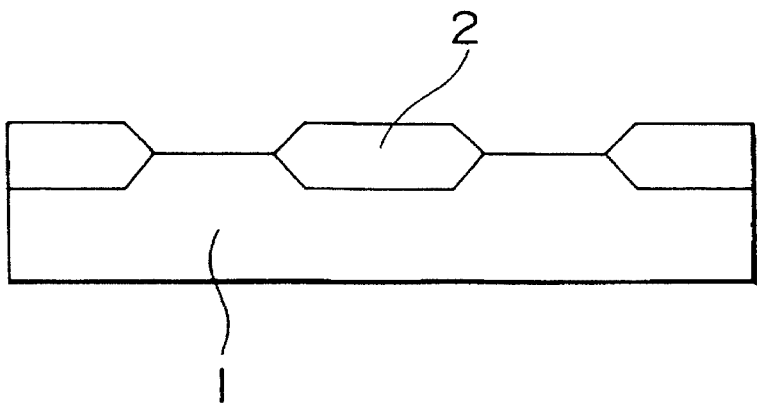

FIG. 17 is a schematic plan view showing a semiconductor memory device manufactured by a method according to a second embodiment of the present invention. FIGS. 18A–18C to FIGS. 25A–25C are cross-sectional views, taken along lines A—A', B—B' and C—C' in FIG. 17, respectively, for showing consecutive steps in the method of the present embodiment. As shown in FIGS. 18A–18C, a plurality of thick field oxide films 2 (first insulating films) extending in a first direction and in parallel to each other are formed on a P-type silicon substrate by using a LOCOS technique. The field oxide films 2 have a thickness of 3000–8000 angstroms.

Figure 19A:
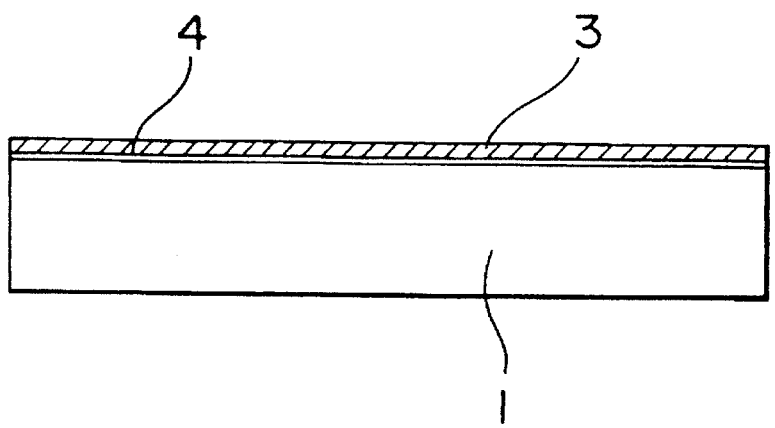
FIGS. 19A, 19B and 19C are cross-sectional views, taken along lines A—A', B—B' and C—C' in FIG. 17, respectively, for showing a second step in manufacturing the nonvolatile semiconductor memory device of FIG. 17.
Figure 19B:
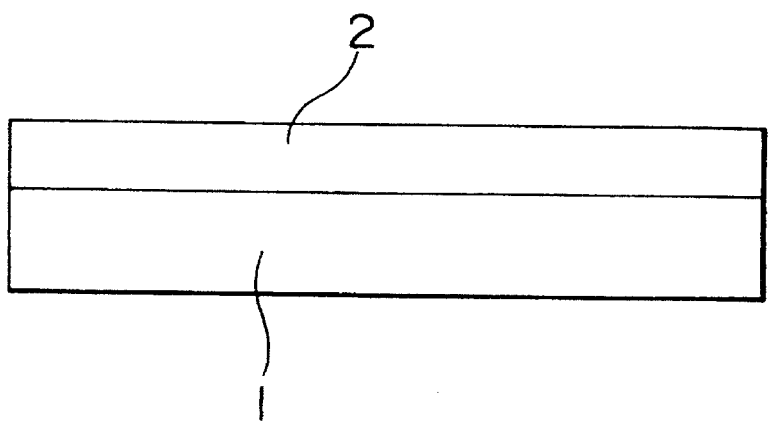
Figure 19C:
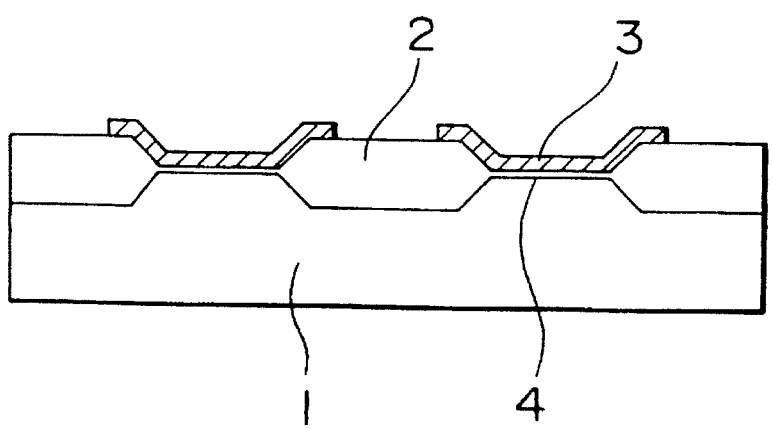

Then, a plurality of thin first gate insulating films (second insulating films) 4 having a thickness of 100–200 angstroms, each made of thermal oxide, are formed between adjacent two of the field oxide films 2. Next, a first polysilicon layer having a thickness of 1000–3000 angstroms is formed by chemical vapor deposition (CVD) on the entire surface. Then, patterning is performed thereto to selectively remove the polysilicon layer on the central portions of the field oxide films 2, thereby forming floating gate layers 3 which cover the first gate insulating layers 4 and edge portions of the field oxide films 2 and extending in parallel to each other. Thus, the structure shown in FIGS. 19A–19C is obtained.

Figure 20A:
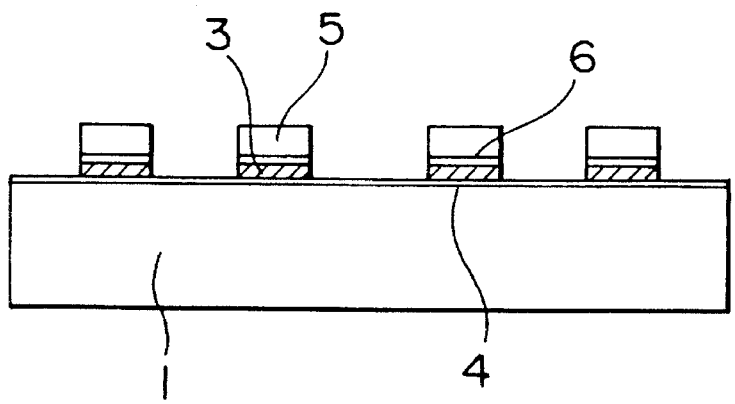
FIGS. 20A, 20B and 20C are cross-sectional views, taken along lines A—A', B—B' and C—C' in FIG. 17, respectively, for showing a third step in manufacturing the nonvolatile semiconductor memory device of FIG. 17.
Figure 20B:
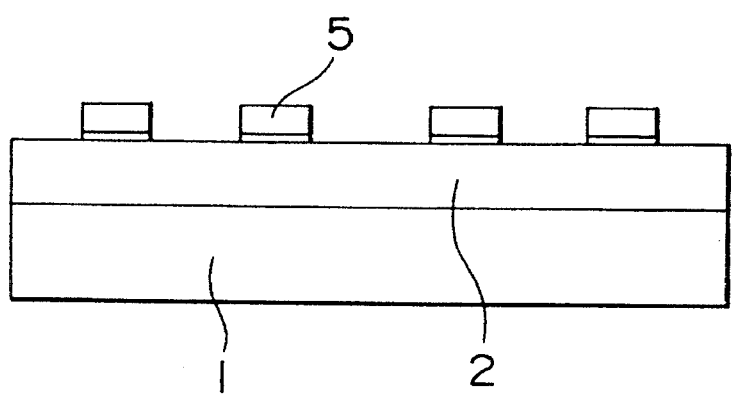
Figure 20C:
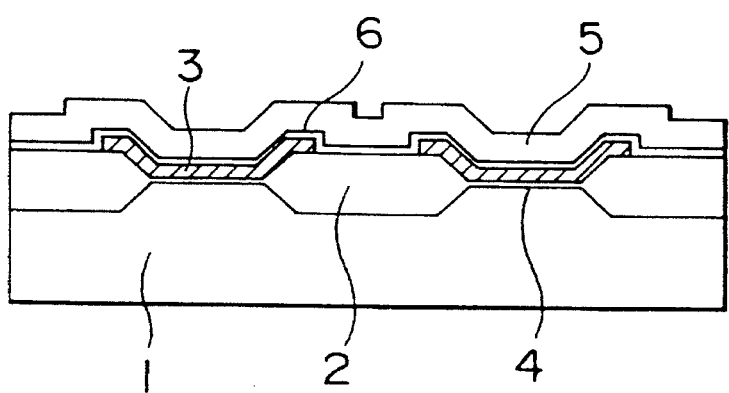

Subsequently, a third insulating film to be formed as second gate insulating films 6 is deposited in a thickness of 100–300 angstroms on the entire surface, the third insulating film having a three-layers structure including a silicon oxide film, a silicon nitride film and another silicon oxide film. Alternatively, second gate insulating films 6 can be formed separately from each other on the respective floating gate layers 3 by oxidation thereof. Subsequently, a second polysilicon layer having a thickness of 2000–4000 angstroms is deposited by CVD on the entire surface. Then, by using a known anisotropic ion-etching technique, patterning is performed on the second polysilicon layer to form control gates 5 extending in a second direction perpendicular to the first direction. Patterning is also performed on the third insulating film to form second gate insulating layer 6 and separate floating gates 3 both aligned with the control gate 5. Thus, gate structures each including a control gate 5, a second gate insulating film 6 and a floating gate 3 is formed on the first gate insulating film 4, as shown in FIGS. 20A–20C.

Figure 21A:
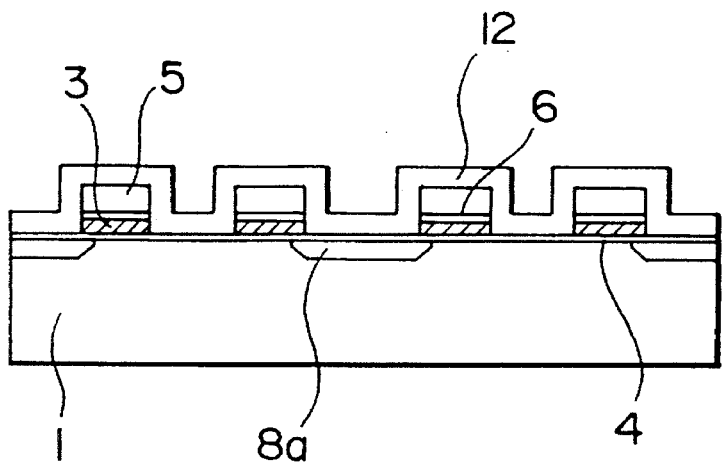
FIGS. 21A, 21B and 21C are cross-sectional views, taken along lines A—A', B—B' and C—C' in FIG. 17, respectively, for showing a fourth step in manufacturing the nonvolatile semiconductor memory device of FIG. 17.
Figure 21B:
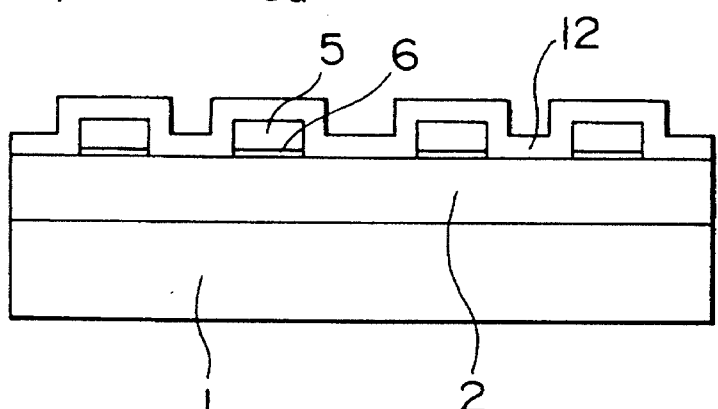
Figure 21C:
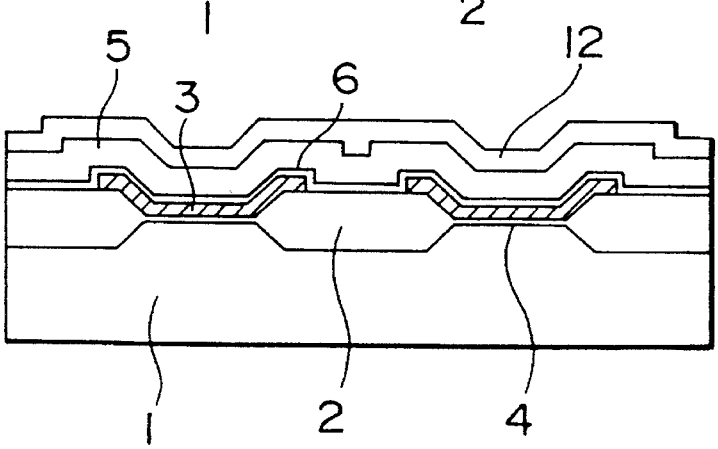
Figure 22A:
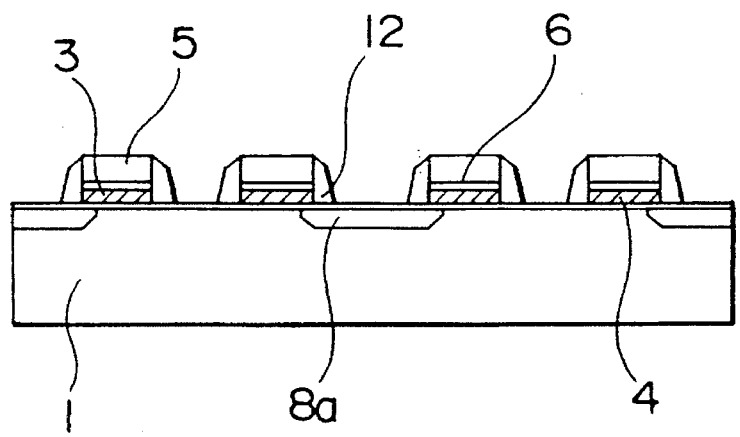
FIGS. 22A, 22B and 22C are cross-sectional views, taken along lines A—A', B—B' and C—C' in FIG. 17, respectively, for showing a fifth step in manufacturing the nonvolatile semiconductor memory device of FIG. 17.
Figure 22B:
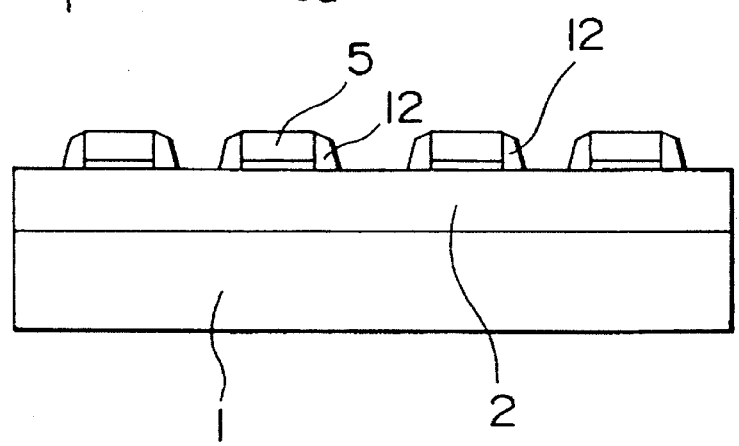
Figure 22C:
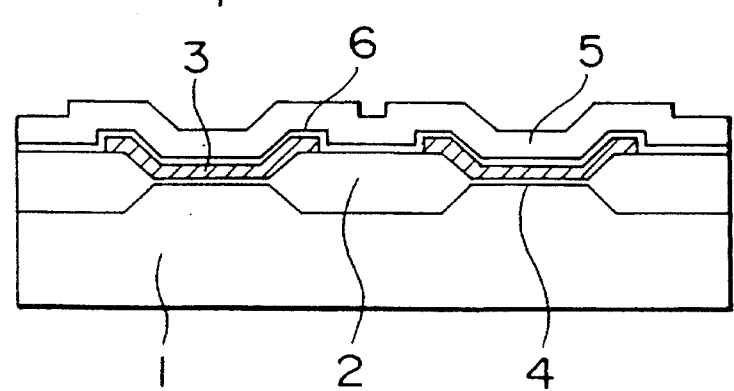
Figure 23A:
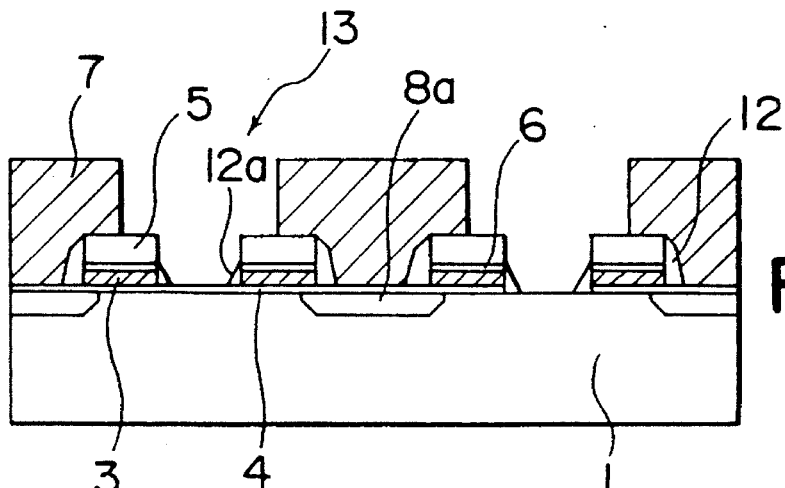
FIGS. 23A, 23B and 23C are cross-sectional views, taken along lines A—A', B—B' and C—C' in FIG. 17, respectively, for showing a sixth step in manufacturing the nonvolatile semiconductor memory device of FIG. 17.
Figure 23B:
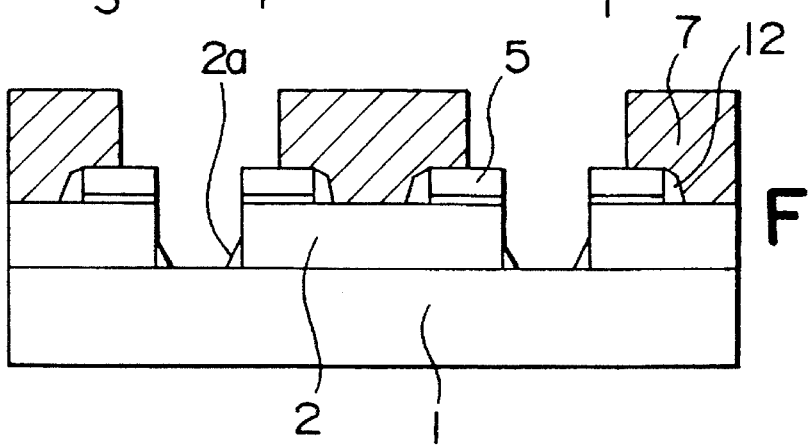
Figure 23C:
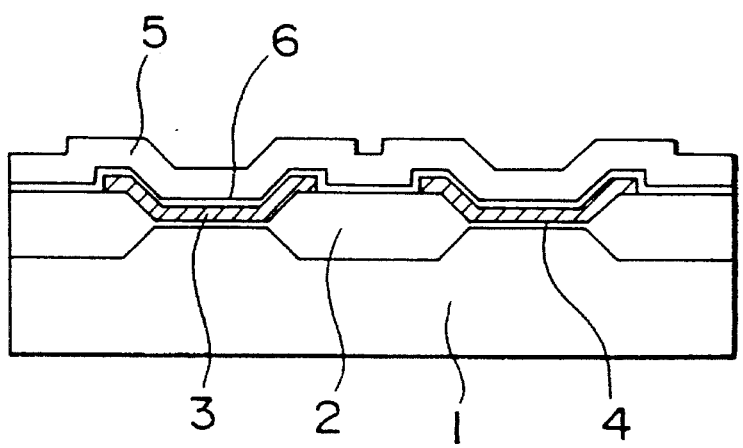

Next, by using an ion implantation technique, N-type impurity ions such as arsenic (As) ions are selectively introduced to the silicon substrate 1 to form drain regions 8a. Then, a fourth insulating film 12 made of silicon oxide is deposited by CVD on the entire surface to obtain the structure shown in FIGS. 21A–21C. Then, the fourth insulating 12 is removed by anisotropic etching to leave the side wall insulating films 12 at both the side walls of each of the gate structures, as shown in FIGS. 22A–22C. Subsequently, a photoresist pattern 7 is formed as having openings 13 at areas between two of the gate structures where source regions are to be formed. Then, anisotropic etching is performed on the field oxide films 2 and the side wall insulating films 12, with the photoresist pattern 7 and the control gates 5 used as a mask, thereby obtaining the structure shown in FIGS. 23A–23C. As shown in these drawings, the side wall insulating films 12 and field oxide films 2 are etched to form residual side walls 12a and 2a, at the peripheral portions of the area where the source regions are to be formed.

Figure 24A:
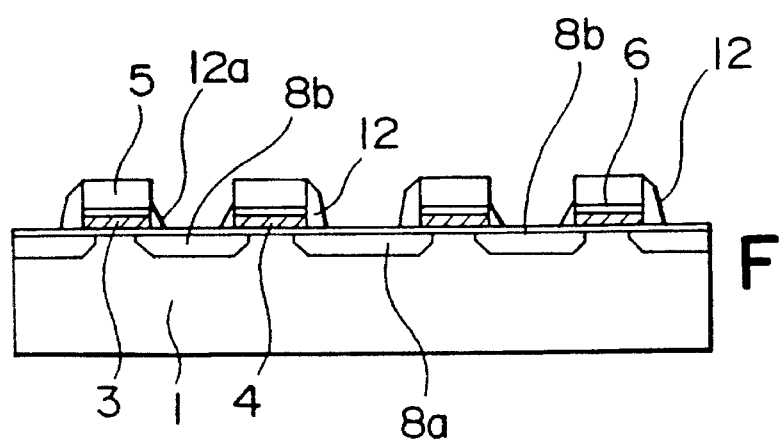
FIGS. 24A, 24B and 24C are cross-sectional views, taken along lines A—A', B—B' and C—C' in FIG. 17, respectively, for showing a seventh step in manufacturing the nonvolatile semiconductor memory device of FIG. 17.
Figure 24B:
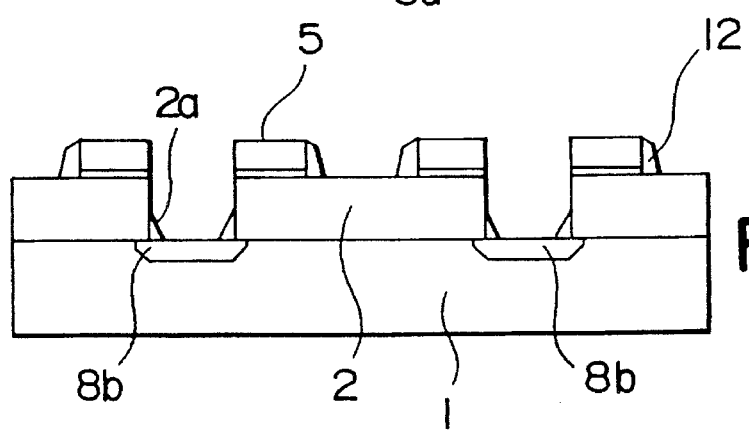
Figure 24C:
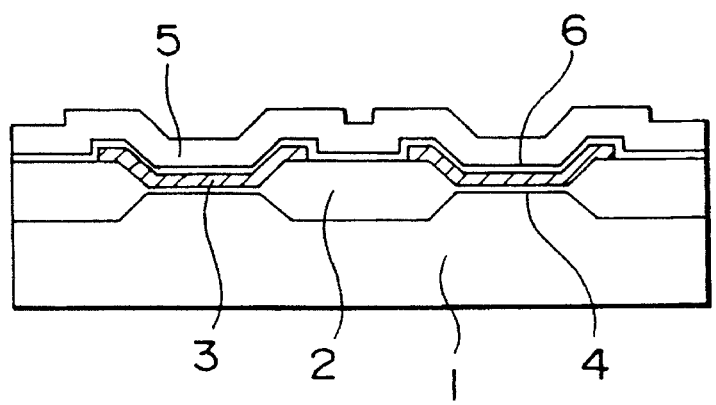
Figure 25A:
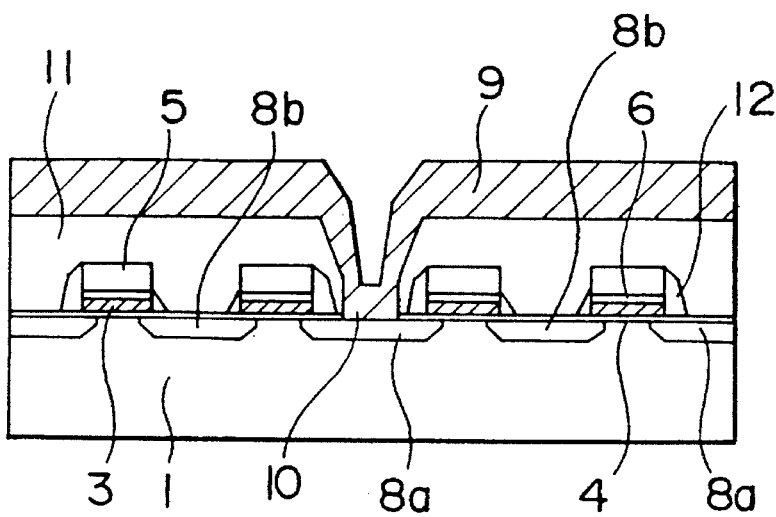
FIGS. 25A, 25B and 25C are cross-sectional views, taken along lines A—A', B—B' and C—C' in FIG. 17, respectively, for showing a final step in manufacturing the nonvolatile semiconductor memory device of FIG. 17.
Figure 25B:
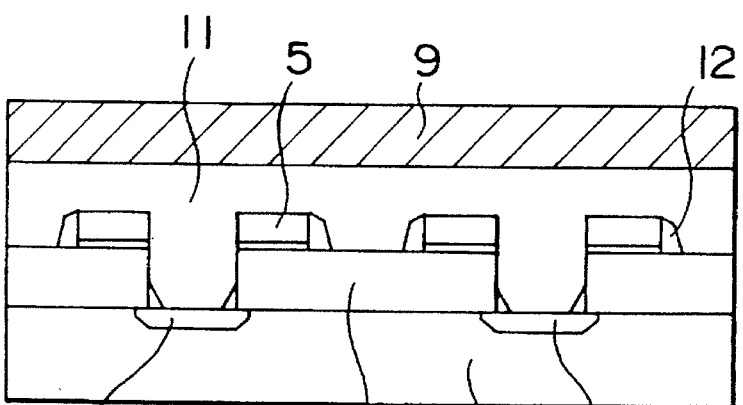
Figure 25C:
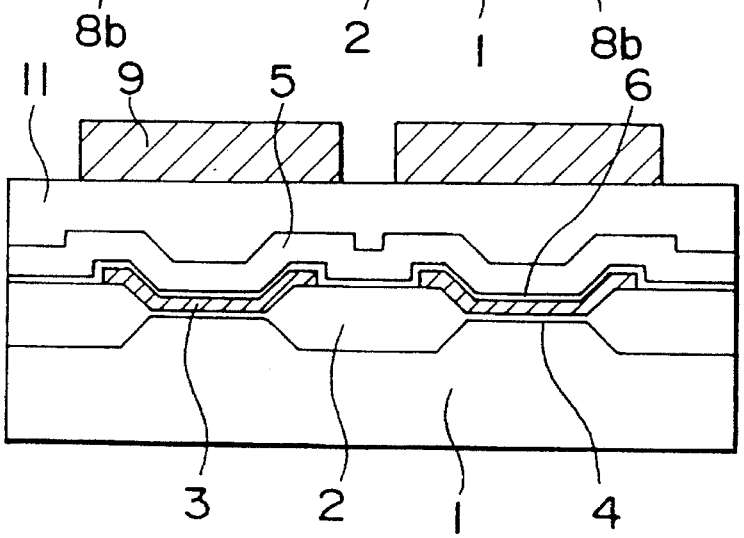

Next, by using an ion-implantation technique or the like, N-type impurity ions such as phosphorus (P) ions are selectively introduced to form source regions, following which N-type impurity ions such as arsenic (As) ions are introduced thereinto. Thus, N-type source regions 8b are formed, as shown in FIGS. 24A–24C. After depositing a fifth insulating film (interlayer insulating film) 11 made of silicon oxide containing, for example, boron (B) or phosphorus (P), contact holes 10 are formed therein by using a known etching technique to expose central portions of the drain regions 8a. An aluminum layer is deposited by CVD and patterning is conducted thereto to form an aluminum interconnection layer 9 and drain electrodes, as shown in FIGS. 25A–25C.

In the method according to the second embodiment, in addition to the advantages of the first embodiment as described before, an additional advantage can be obtained in which, if a side wall structure is employed in a peripheral circuit in the memory device, side wall insulating films for the gate structure in the memory cell can be formed concurrently with the side wall films of the transistors in the peripheral circuit. Accordingly, it is not necessary to employ an independent step for forming the side wall insulating films for memory cells.

Further in the second embodiment, by forming a side wall structure in memory cell transistors, both the drain regions and source regions can be securely formed in an LDD structure. Hence, the memory device is suited for applications of high voltages, so that a wide use of the memory devices can be obtained.

The methods for manufacturing nonvolatile semiconductor memory devices according to the embodiments of the present invention can reduce deterioration in the first gate oxide films caused by plasma damage, so that it is possible to improve a rewritable count of the semiconductor memory device. In detail, as seen from FIG. 8, nonvolatile semiconductor memory device manufactured according to the method of the present invention improve a rewritable count substantially by 3 digits as compared to that manufactured by the conventional method.

Although the present invention is described with reference to the preferred embodiments thereof, the present invention is not limited to such embodiments and it will be obvious for those skilled in the art that various modifications or alterations can be easily made based on the above embodiments within the scope of the present invention.

What is claimed is:

1. A method for manufacturing a nonvolatile semiconductor memory device including steps of: forming a plurality of first insulating films extending in a first direction and parallel to each other on a semiconductor substrate; forming a plurality of second insulating films each extending on the semiconductor substrate between adjacent two of the first insulating films; forming on each of the second insulating films a plurality of gate structures each including consecutive layers of a floating gate, a third insulating film and a control gate; forming a fourth insulating film at least on the gate structures; selectively dry-etching the fourth insulating film to leave residual side wall films at a first side of each of the gate structures; after said dry-etching, selectively introducing impurity ions of a second conductivity type to first regions of the semiconductor substrate adjacent to the first side of each of the gate structures; and selectively introducing impurity ions to second regions of the semiconductor substrate adjacent to a second side of each of the gate structures opposite to the first side.

2. A method for manufacturing a nonvolatile semiconductor memory device including steps of: forming a plurality of first insulating flints extending in a first direction and parallel to each other on a semiconductor substrate; forming a plurality of second insulating films each extending on the semiconductor substrate between adjacent two of the first insulating films; forming on each of the second insulating films a plurality of gate structures each including consecutive layers of a floating gate, a third insulating film and a control gate; forming a fourth insulating film at least on the gate structures; forming a photoresist pattern film; selectively dry-etching the fourth insulating film to leave residual side wall films at a first side of each of the gate structures; after said dry-etching, selectively introducing impurity ions of a second conductivity type to first regions of the semiconductor substrate adjacent to the first side of each of the gate structures; and selectively introducing impurity ions to second regions of the semiconductor substrate adjacent to a second side of each of the gate structures opposite to the first side.

3. A method for manufacturing a nonvolatile semiconductor memory device as defined in claim 2 wherein said selectively introducing of impurity ions to the second regions is conducted before said forming of the fourth insulating film.

4. A method for manufacturing a nonvolatile semiconductor memory device including steps of: forming a plurality of first insulating films extending in a first direction and parallel to each other on a semiconductor substrate; forming a plurality of second insulating films each extending on the semiconductor substrate between adjacent two of the first insulating films: forming on each of the second insulating films a plurality of gate structures each including consecutive layers of a floating gate, a third insulating film and a control gate; forming a fourth insulating film at least on the gate structures; selectively dry-etching the fourth insulating film to leave residual side wall films at a first side of each of the gate structures; after said dry-etching, selectively introducing impurity ions of a second conductivity type to first regions of the semiconductor substrate adjacent to the first side of each of the gate structures; and selectively introducing impurity ions to second regions of the semiconductor substrate adjacent to a second side of each of the gate structures opposite to the first side wherein said dry-etching includes a first dry-etching and a second dry-etching, and said selectively introducing of impurity ions to the second regions is conducted between said first dry-etching and said second dry-etching.

5. A method for manufacturing a nonvolatile semiconductor memory device as defined in claim 4 wherein said first dry-etching etches the fourth insulating film to leave side wall insulating films at peripheral portions of both the first regions and second regions, and said second dry-etching etches the first insulating films and the side wall insulating films at the first regions to leave the residual side wall films.

* * * * *